(12) United States Patent
Ohkawara et al.

(10) Patent No.: US 7,644,747 B2
(45) Date of Patent: Jan. 12, 2010

(54) RECTANGULAR SUBSTRATE DIVIDING APPARATUS

(75) Inventors: Satoshi Ohkawara, Tokyo (JP); Kuniharu Izumi, Tokyo (JP); Shigeru Ishii, Tokyo (JP); Ryu Komine, Tokyo (JP)

(73) Assignee: Disco Corporation, Tokyo (JP)

( * ) Notice: Subject to any disclaimer, the term of this patent is extended or adjusted under 35 U.S.C. 154(b) by 756 days.

(21) Appl. No.: 11/288,285

(22) Filed: Nov. 29, 2005

(65) Prior Publication Data

US 2006/0113595 A1 Jun. 1, 2006

(30) Foreign Application Priority Data

Nov. 30, 2004 (JP) ............... 2004-346349

(51) Int. Cl.
*H01L 27/12* (2006.01)
(52) U.S. Cl. ............... 156/584; 156/344; 156/268; 438/464; 438/976
(58) Field of Classification Search ............ 156/344, 156/584, 268; 438/464, 976
See application file for complete search history.

(56) References Cited

U.S. PATENT DOCUMENTS

| | | | |
|---|---|---|---|
| 4,798,645 A * | 1/1989 | Pak ............... | 156/344 |
| 5,254,201 A * | 10/1993 | Konda et al. ........ | 156/344 |
| 5,332,406 A * | 7/1994 | Takeuchi et al. ...... | 438/464 |
| 5,564,888 A * | 10/1996 | Doan ............... | 414/751.1 |
| 5,725,728 A * | 3/1998 | Fuke et al. ......... | 156/344 |
| 6,149,758 A * | 11/2000 | Tsujimoto et al. ..... | 156/344 |
| 6,341,740 B2 * | 1/2002 | Sekiya et al. ........ | 241/101.2 |
| 6,932,136 B1 * | 8/2005 | Kelkar et al. ........ | 156/584 |
| 2004/0265100 A1 * | 12/2004 | Ohkawara et al. ..... | 414/416.03 |

FOREIGN PATENT DOCUMENTS

JP 2000-208445 7/2000
JP 2000-232080 8/2000

* cited by examiner

*Primary Examiner*—Kat Wyrozebski
*Assistant Examiner*—John Blades
(74) *Attorney, Agent, or Firm*—Smith, Gambrell & Russell, LLP

(57) ABSTRACT

A rectangular substrate dividing apparatus, which can divide a rectangular substrate in a smaller space, accommodate devices, formed as individual pieces by the division, into device cases, and pick up the devices reliably and efficiently from a protective tape affixed to the back of the rectangular substrate, is provided. This apparatus separates a rectangular substrate, to whose back a protective tape is affixed and on which a plurality of devices are partitioned by a lattice of scheduled-separation lines, along the scheduled-separation lines to divide the rectangular substrate into the individual devices, and accommodates the devices in device cases. In a cutting-responsible region, the rectangular substrate is carried out of cassettes, cut by a cutter, and then cleaned by a cleaner. In a tape peeling-responsible region, the devices are picked up with the protective tape being peeled off. In a device accommodation-responsible region, the picked-up individual devices are accommodated into device cases.

8 Claims, 22 Drawing Sheets

RECTANGULAR SUBSTRATE DIVIDING APPARATUS

TECHNICAL FIELD

This invention relates to an apparatus for dividing various substrates of a rectangular shape into individual devices.

BACKGROUND ART

A rectangular substrate, such as CSP (chip size package), which has a plurality of integrated circuits (e.g., IC and LSI) formed and packaged in resin, is divided into individual devices by a dividing apparatus such as a dicing apparatus. These individual devices are accommodated in a device case and transported to an assembly step for electronic equipment. In the assembly step, the individual devices are mounted in various types of electronic equipment.

Generally, as disclosed in Japanese Patent Application Laid-Open No. 2000-232080 (hereinafter referred to as Patent Document 1), a dedicated device accommodation apparatus is used for accommodating devices into a device case. The device accommodation apparatus is installed adjacent to the dividing apparatus so that individual devices formed as individual pieces by the dividing apparatus can be immediately accommodated into the device case by the device accommodation apparatus.

Generally, a rectangular substrate to be divided is affixed to an adhesive surface of a tape T adhered to an annular frame F so as to close its opening. The rectangular substrate is diced while being held and integrated with the frame F via the tape T. In this state, the diced rectangular substrate is transported to the device accommodation apparatus, where the individual devices are accommodated in the device case (see, for example, Patent Document 1). As disclosed in Japanese Patent Application Laid-Open No. 2000-208445 (hereinafter referred to as Patent Document 2), a proposal has been made for a method which divides a rectangular substrate into individual devices, with only a protective tape of the same shape as that of the rectangular substrate being affixed to the back of the rectangular substrate, without using the annular frame.

OBJECT AND SUMMARY OF THE INVENTION

However, the installation of the device accommodation apparatus in addition to the dicing apparatus requires an installation space nearly twice as large, posing the problems that a space saving cannot be achieved, and costs are increased. If the rectangular substrate integrated with the frame via the tape is to be diced, moreover, the dicing apparatus has to hold the frame which is larger than the rectangular substrate to be diced, thus upsizing the dicing apparatus according to the size of the frame. When the rectangular substrate, integrated with the frame via the tape, is transported to the device accommodation apparatus, the frame has to be held in the device accommodation apparatus, so that the device accommodation apparatus also becomes upsized. Furthermore, an area for accommodating the used frame also has to be secured. This is another factor for upsizing of the apparatus.

On the other hand, the method of performing dicing while sticking the protective tape to the back of the rectangular substrate, without using the frame, is also available, as in the invention disclosed in Patent Document 2. In this case, the individual devices adhered to the protective tape have to be picked up, thus presenting the problem of difficulty in reliably peeling the devices. As shown in Patent Document 2, it is difficult to pick up the devices reliably, even if the adhesive force of the protective tape is decreased before pickup. Moreover, a special means for decreasing the adhesive force is necessary. Since a time for this purpose is also required, productivity also declines. Furthermore, a special means for discarding the protective tape remaining after pickup of the devices is also needed.

It is an object of the present invention to be capable of dividing the rectangular substrate in a smaller space, accommodating devices, which have been formed as individual pieces by the division, into the device case, and picking up the devices reliably and efficiently from the protective tape affixed to the back of the rectangular substrate.

To attain the above object, the present invention relates to a rectangular substrate dividing apparatus for separating a rectangular substrate, to whose back a protective tape is affixed and on which scheduled-separation lines for division of the rectangular substrate into individual devices are formed, along the scheduled-separation lines to divide the rectangular substrate into the individual devices, and accommodating the individual devices in a device case. The rectangular substrate dividing apparatus is composed of a cutting-responsible region for cutting the rectangular substrate to divide it into the individual devices, a tape peeling-responsible region for peeling the protective tape affixed to the back of the rectangular substrate, and a device accommodation-responsible region for accommodating the individual devices in the device case. The cutting-responsible region is composed of a cassette table for bearing a cassette accommodating a plurality of the rectangular substrates, a carry-out means for carrying the rectangular substrate out of the cassette, a chuck table for holding the carried-out rectangular substrate, a cutting means for cutting the rectangular substrate held on the chuck table along the scheduled-separation lines to divide it into the individual devices, and a cleaning means for cleaning the cut rectangular substrate. The tape peeling-responsible region is composed of a temporary placement table for temporarily bearing the cut and cleaned rectangular substrate, a pickup table for bearing the devices when the individual devices constituting the rectangular substrate are picked up, and a device transfer means having the function of transferring the devices from the temporary placement table to the pickup table while peeling the protective tape affixed to the back of the rectangular substrate. The device accommodation-responsible region at least includes a pickup means for picking up the device transferred to the pickup table and accommodating it in the device case, an empty device case storage portion for storing an empty device case, a device case positioning means for withdrawing the empty device case from the empty device case storage portion and bringing the empty device case to a device accommodation position which is a position where the device can be accommodated by the pickup means, and an accommodated device case storage portion for storing the device case accommodating the devices.

In the above tape peeling-responsible region, it is preferred that the pickup table is composed of a first table and a second table; the second table is disposed with a predetermined spacing from the temporary placement table; the first table is disposed to be movable between the temporary placement table and the second table; and the device transfer means is composed of a gripping portion for gripping an unnecessary end portion of the rectangular substrate, which is placed on the temporary placement table, together with the protective tape, a press roller for pressing the rectangular substrate placed on the temporary placement table, a pusher for pushing the rectangular substrate between the press roller and the temporary placement table and moving it toward the first table when the first table is located at a position close to the temporary placement table, and a gripping portion drive portion for lowering the gripping portion at least below the temporary placement table and peeling the protective tape from the back of the rectangular substrate. Above the pickup table, a device moving means is preferably disposed which moves the devices placed on the first table to the second table when the first table is located at a position close to the second table, and the devices are placed on the first table. Desirably, the pickup means picks up the device moved to the second table. On this occasion, the first table and the second table may be in contact with each other, or may be spaced from each other to such a degree that they can move the devices. In this case, the gripping portion drive portion is desirably composed of a base portion movable in a direction separated from the first table, a pivotal portion pivotably supported by the base portion, a guide member for guiding a pivotal movement of the pivotal portion, and a raising and lowering drive portion fixed to the pivotal portion for raising and lowering the gripping portion.

Below the temporary placement table, a protective tape accommodation portion is preferably disposed which accommodates the protective tape peeled from the rectangular substrate by the gripping portion drive portion. In this case, it is preferred that an end material accommodation portion for accommodating end materials constituting the cut rectangular substrate is disposed on a side opposite to the first table across the second table. Preferably, the device moving means is furnished with a device push-out portion for pushing out and moving the devices placed on the first table toward the second table, and an end material push-out portion for pushing out the end materials remaining on the second table to drop them from the second table into the end material accommodation portion.

In the device accommodation-responsible region, the pickup means preferably includes a determination portion for determining whether the device, as an object to be picked up, is an acceptable product or a defective product. The device case is preferably composed of an acceptable product device case for accommodating the devices as acceptable products, and a defective product device case for accommodating the devices as defective products. The accommodated device case storage portion is preferably composed of an acceptable product device case storage portion for storing the acceptable product device case, and a defective product device case storage portion for storing the defective product device case. The device case positioning means is preferably composed of an acceptable product device case positioning means for withdrawing the empty device case from the empty device case storage portion, and bringing the empty device case, as an acceptable product device case, to an acceptable product device accommodation position which is a position for accommodation of the device as an acceptable product, and a defective product device case positioning means for withdrawing the empty device case from the empty device case storage portion, and bringing the empty device case, as a defective product device case, to a defective product device accommodation position which is a position for accommodation of the device as a defective product.

In the cutting-responsible region, there are provided, preferably, a posture correction means for correcting the posture of the rectangular substrate carried out of the cassette, a first transport means for holding the rectangular substrate having the posture corrected by the posture correction means, and placing it on the chuck table, a second transport means for transporting the cut rectangular substrate held on the chuck table to the cleaning means, and a third transport means for transporting the cleaned rectangular substrate to the temporary placement table. In the cutting-responsible region, it is also preferred that two or more of the cassettes can be placed on the cassette table, and a cassette positioning means is disposed which selectively brings the cassette table to a position where the rectangular substrate accommodated in any of the cassettes can be carried outward by the carry-out means.

In the cutting-responsible region, it is preferred that the cassette table, the carry-out means, and the cleaning means are disposed on a first straight line, the cutting means is disposed on a second straight line perpendicularly intersecting the first straight line, and the chuck table is adapted to be movable on the second straight line. In the tape peeling-responsible region, it is preferred that the temporary placement table is disposed on a straight line parallel to the second straight line with respect to the cleaning means, and the temporary placement table and the pickup table are disposed on a straight line parallel to the first straight line. In the device accommodation-responsible region, it is preferred that the empty device case storage portion and the accommodated device case storage portion are disposed on a straight line parallel to the first straight line, and the device case positioning means is disposed directly below the empty device case storage portion and directly below the accommodated device case storage portion, respectively.

According to the present invention, in the cutting-responsible region, the rectangular substrate having the protective tape affixed to the back thereof is cut to be divided into individual devices, and is then cleaned. In the tape peeling-responsible region, the devices can be peeled from the protective tape reliably, easily and efficiently, and can also be transferred to the pickup table. The devices, which have been transferred to the pickup table, can be accommodated in the device case in the device accommodation-responsible region. Thus, the actions ranging from cutting to accommodation of the device can be performed by one apparatus. Particularly, peeling of the protective tape and the transfer of the devices to the pickup table can be carried out simultaneously. Hence, productivity is extremely high. Since the annular frame need not to be used, moreover, a saving in space due to downsizing of the apparatus can be achieved.

The present invention is also configured as follows: The pickup table is composed of a first table and a second table; the second table is disposed with a predetermined spacing from the temporary placement table; the first table is disposed to be movable between the temporary placement table and the second table; and the device transfer means is composed of a gripping portion for gripping an unnecessary end portion of the rectangular substrate, which is placed on the temporary placement table, together with the protective tape, a press roller for pressing the rectangular substrate placed on the temporary placement table, a pusher for pushing the rectangular substrate between the press roller and the temporary placement table and moving it toward the first table when the first table is located at a position close to the temporary placement table, and a gripping portion drive portion for lowering the gripping portion at least below the temporary placement table and peeling the protective tape from the back of the rectangular substrate. Above the pickup table, a device moving means is disposed which moves the devices placed on the first table to the second table when the first table is located at a position close to the second table, and the devices are placed on the first table. The pickup means picks up the device moved to the second table. In this configuration, the devices placed on the temporary placement table are transferred to the first table, while being stripped of the protective tape by the device transfer means. The devices transferred to the first table are moved to the second table by the device moving means, and the device moved to the second table is picked up and accommodated into the device case by the pickup means. The first table can approach the temporary placement table or the second table. While the first table is approaching the second table, therefore, a sufficient gap for entry of the gripping portion can be formed between the first table and the temporary placement table, and an unnecessary end portion constituting the rectangular substrate and the protective tape affixed to the back of the rectangular substrate can be reliably gripped by the gripping portion. In this case, moreover, the movement of the devices from the first table to the second table by the device moving means can be performed reliably. While the first table is approaching the temporary placement table, on the other hand, the transfer of the devices from the temporary placement table to the first table can be performed reliably. This approach of the first table to the temporary placement table can prevent damage to the devices during their transfer.

The gripping portion drive portion may be composed of the base portion movable in a direction separated from the first table, the pivotal portion pivotably supported by the base portion, the guide member for guiding a pivotal movement of the pivotal portion, and the raising and lowering drive portion fixed to the pivotal portion for raising and lowering the gripping portion. According to this feature, when the base portion moves in a direction reverse to the moving direction of the devices while the gripping portion is gripping the end portion of the protective tape, the pivotal portion pivots by being guided by the guide member. In this state, the base portion can move in a direction spaced from the first table. Thus, the protective tape can be easily peeled off by the movement of the base portion and the pivotal movement of the pivotal portion.

If the protective tape accommodation portion for accommodating the protective tape peeled from the rectangular substrate by the gripping portion drive portion is disposed below the temporary placement table, the protective tape peeled by the device transfer means is automatically accommodated into the protective tape accommodation portion. Thus, a special structure for discarding the protective tape is not required. Thus, the corresponding space can be saved. There may be a case where the gripping portion drive portion is composed of the base portion movable in a direction separated from the first table, the pivotal portion pivotably supported by the base portion, the guide member for guiding a pivotal movement of the pivotal portion, and the raising and lowering drive portion fixed to the pivotal portion for raising and lowering the gripping portion. In this case, when the gripping of the protective tape by the gripping portion is released after completely peeling the protective tape, the protective tape spontaneously falls and can be accommodated into the protective tape accommodation portion.

There may be a case where the end material accommodation portion for accommodating end materials constituting the cut rectangular substrate is disposed on a side opposite to the first table across the second table. Also, the device moving means may be furnished with the device push-out portion for pushing out and moving the devices placed on the first table toward the second table, and the end material push-out portion for pushing out the end materials remaining on the second table to drop them from the second table into the end material accommodation portion. In this case, the device moving means moves the devices placed on the first table to the second table and, at the same time, can accommodate the end materials into the end material accommodation portion. This is efficient, and does not need a dedicated contrivance for accommodating the end materials into the end material accommodation portion. Thus, a space saving can be achieved.

In the device accommodation-responsible region, the pickup means may include the determination portion for determining whether the device, as an object to be picked up, is an acceptable product or a defective product. The device case may be composed of the acceptable product device case for accommodating the devices as acceptable products, and the defective product device case for accommodating the devices as defective products. The accommodated device case storage portion may be composed of the acceptable product device case storage portion for storing the acceptable product device case, and the defective product device case storage portion for storing the defective product device case. The device case positioning means may be composed of the acceptable product device case positioning means for withdrawing the empty device case from the empty device case storage portion, and bringing the empty device case, as an acceptable product device case, to the acceptable product device accommodation position which is a position for accommodation of the device as an acceptable product, and the defective product device case positioning means for withdrawing the empty device case from the empty device case storage portion, and bringing the empty device case, as a defective product device case, to the defective product device accommodation position which is a position for accommodation of the device as a defective product. According to these features, the determination portion can determine whether the device is an acceptable product or a defective product at the time of pickup, so that there is no decrease in productivity. Also, the devices as acceptable products and the devices as defective products can be separated from each other and accommodated into different device cases based on the results of determination in the determination portion. Thus, it is not necessary to distinguish between acceptable products and defective products at a later step.

In the cutting-responsible region, there may be provided the posture correction means for correcting the posture of the rectangular substrate carried out of the cassette, the first transport means for holding the rectangular substrate having the posture corrected by the posture correction means, and placing it on the chuck table, the second transport means for transporting the cut rectangular substrate held on the chuck table to the cleaning means, and the third transport means for transporting the cleaned rectangular substrate to the temporary placement table. According to these features, even if there are variations in the position of accommodation, or the direction of accommodation, of the rectangular substrate within the cassette, the position or direction of the rectangular substrate is rendered constant by the posture correction means. In this state, the rectangular substrate can be transported to the chuck table and cut, so that cutting can be carried out smoothly and accurately. After cutting, the cut rectangular substrate can be transported to the cleaning means. After cleaning, the cleaned rectangular substrate can be transported to the temporary placement table. Thus, the rectangular substrate can be smoothly transported to the tape peeling-responsible region.

In the cutting-responsible region, there may be a case where two or more of the cassettes can be placed on the cassette table, and the cassette positioning means is disposed which selectively brings the cassette table to a position where the rectangular substrate accommodated in any of the cassettes can be carried out by the carry-out means. In this case, if a plurality of the cassettes are placed on the cassette table, the rectangular substrates accommodated in the respective cassettes can be carried out of the cassettes one after another and cut. This is efficient, and the plural cassettes can be put together and placed on the cassette table, thus resulting in simplified work.

In the cutting-responsible region, there may be a case where the cassette table, the carry-out means, and the cleaning means are disposed on a first straight line, the cutting means is disposed on a second straight line perpendicularly intersecting the first straight line, and the chuck table is adapted to be movable on the second straight line. In the tape peeling-responsible region, the temporary placement table may be disposed on a straight line parallel to the second straight line with respect to the cleaning means, and the temporary placement table and the pickup table may be disposed on a straight line parallel to the first straight line. In the device accommodation-responsible region, the empty device case storage portion and the accommodated device case storage portion may be disposed on a straight line parallel to the first straight line, and the device case positioning means may be disposed directly below the empty device case storage portion and directly below the accommodated device case storage portion, respectively. According to these features, in any of the cutting-responsible region, the tape peeling-responsible region, and the device accommodation-responsible region, the rectangular substrate need not make an unnecessary motion, and there is no surplus in the movement of the rectangular substrate between the respective responsible regions. Thus, a space saving due to the downsizing of the apparatus and a high efficiency can be achieved.

PREFERRED EMBODIMENTS OF THE INVENTION

Figure 1:
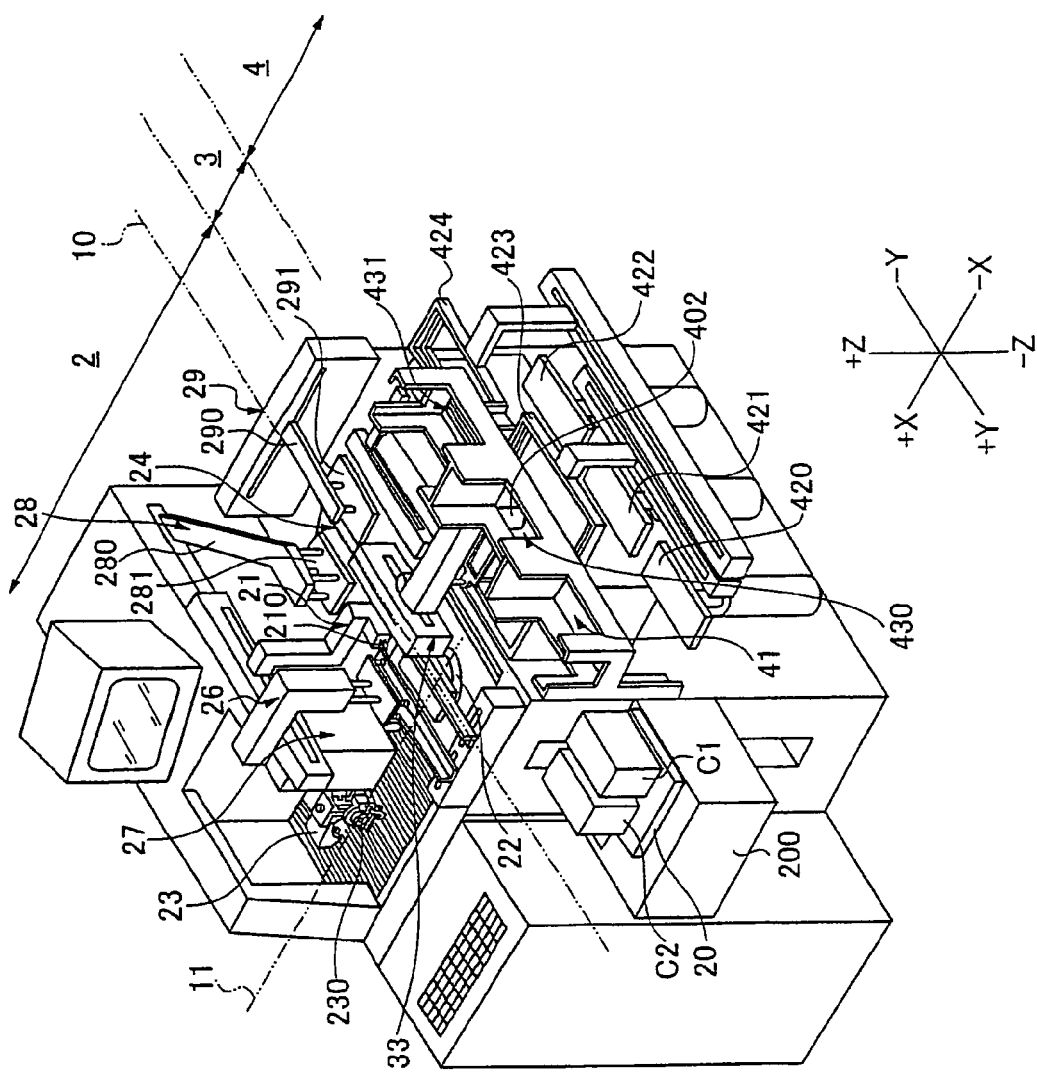
FIG. 1 is a perspective view showing an example of a rectangular substrate dividing apparatus according to the present invention.
Figure 2:
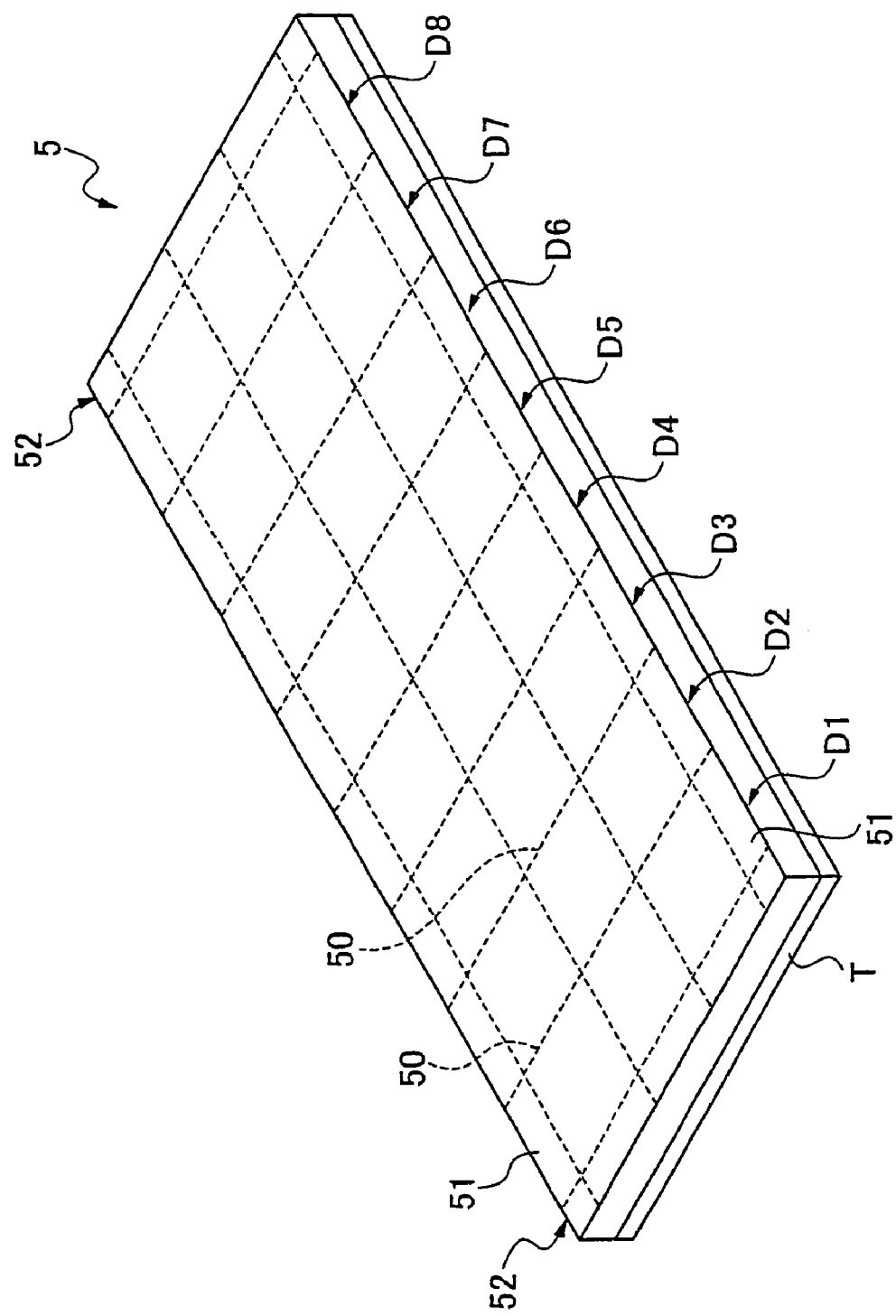
FIG. 2 is a perspective view showing an example of a rectangular substrate.

In a dividing apparatus 1 shown in FIG. 1, a rectangular substrate 5 shown, for example, in FIG. 2 can be separated into pieces by cutting it along scheduled-separation lines 50 formed in a longitudinal direction and a transverse direction. The rectangular substrate 5 shown in FIG. 2 is partitioned by the scheduled-separation lines 50 to form devices. The devices, in the illustrated example, are composed of a first device row D1 to an eighth device row D8, and each device row is composed of three of the devices and two end materials 51 located at both ends. Unnecessary end portions 52 are formed outwardly of the first device row D1 and the eighth device row D8 of the rectangular substrate 5. The end materials 51 and the unnecessary end portions 52 are finally discarded. A protective tape T for device protection is affixed to the back of the rectangular substrate 5. The rectangular substrate 5 can be divided into individual devices by separating it along the scheduled-separation lines 50 with the use of the dividing apparatus 1 show in FIG. 1. In the dividing apparatus 1, the individual devices can be accommodated in a device case to be described later. A CSP or glass substrate, for example, is available as the rectangular substrate 5.

The dividing apparatus 1, as shown in FIG. 1, is composed of a cutting-responsible region 2 where the rectangular substrate 5 having the protective tape T affixed to the back thereof is cut longitudinally and transversely and thereby divided into individual devices, a tape peeling-responsible region 3 where the protective tape T is peeled from the rectangular substrate 5, and a device accommodation-responsible region 4 where the individual devices are accommodated in device cases.

The cutting-responsible region 2 is furnished at least with a cassette table 20 for bearing cassettes accommodating a plurality of the rectangular substrates 5, a carry-out means 21 for carrying the rectangular substrate 5 out from the cassette table 20, a chuck table 22 fixed on the upper surface of a rotating base 22a, adapted to hold the carried-out rectangular substrate 5, and capable of rotation, a cutting means 23 for cutting the rectangular substrate 5 held on the chuck table 22 along the scheduled-separation lines 50 to divide it into individual devices, and a cleaning means 24 for cleaning the cut rectangular substrate 5. In the cutting-responsible region 2, dicing of the rectangular substrate 5 by cutting and cleaning of the cut rectangular substrate 5 are carried out.

The carry-out means 21 is movable in a Y-axis direction, and has a pinching portion 210 for pinching an end portion of the rectangular substrate 5. The cassette table 20 can ascend and descend in a Z-axis direction together with a cassette positioning means 200 (to be described later), and can bear a plurality of the cassettes. In the illustrated example, two cassettes C1 and C2 can be placed on the cassette table 20. In correspondence with the cassette table 20, the cassette positioning means 200, which selectively locates the cassette table 20 at a position where the rectangular substrate accommodated in either cassette can be carried out by the carry-out means 21, concretely, at a position on an extension, in the +Y-direction, of a moving path of the carry-out means 21, is disposed below the cassette table 20. The cassette table 20 can also be moved in an X-axis direction. Because of this configuration, the rectangular substrates 5 stored in the cassettes C1 and C2 can be efficiently carried out, one after another, toward the carry-out means 21 in a next step.

Figure 3:
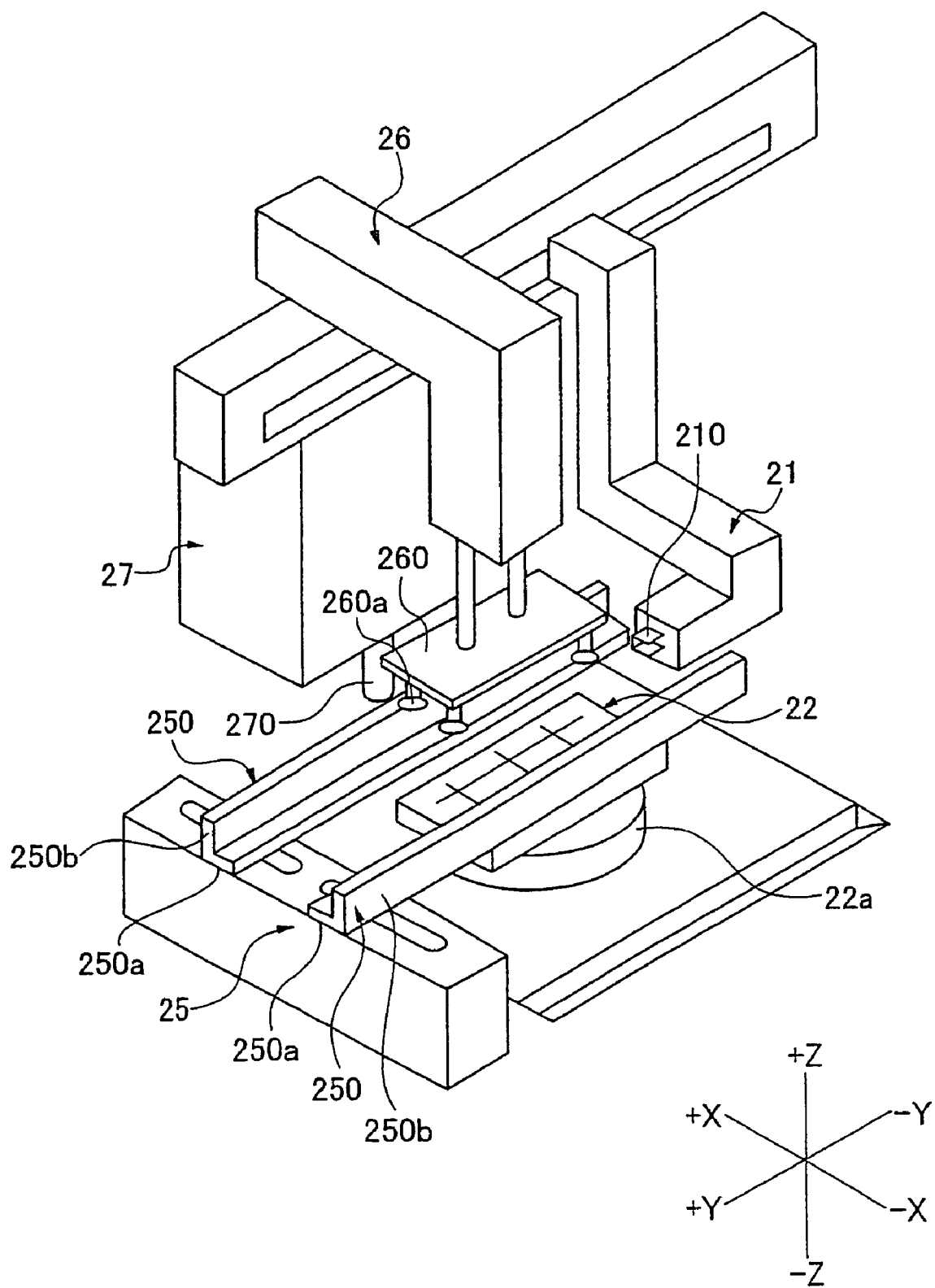
FIG. 3 is a perspective view showing a portion of a cutting-responsible region.

As shown in FIG. 3, a posture correction means 25, which comprises two opening and closing members 250 of a long length in the Y-axis direction and of an L-shaped section arranged in opposed relationship, is disposed above the chuck table 22 and between the cassette table 20 and the carry-out means 21. The two opening and closing members 250 are each composed of a bottom portion 250a having a horizontal surface, and a side portion 250b having a vertical surface. These opening and closing members 250 move parallel toward or away from each other, form a closed state when approaching each other, and form a first open state and a second open state when departing from each other. When the rectangular substrate 5 is carried out of the cassette C1 or the cassette C2, the posture correction means 25 is in the first open state, and the carried-out rectangular substrate 5 is placed on the two bottom portions 250a. That is, the first open state is a state enough open to allow the rectangular substrate 5 to be carried out, and is such an open state that the rectangular substrate does not fall downward. On the other hand, the second open state is such an open state that the rectangular substrate 5 can move between the two opening and closing members 250 in a vertical direction. When the two opening and closing members 250 approach each other to form a closed state, the rectangular substrate 5 contacts the side portions 250b. As a result, the rectangular substrate 5 has its posture corrected, is aligned with a constant position, and is pointed in a constant direction.

When the cassette table 20 is positioned at a predetermined height, the carry-out means 21 moves in the +Y-direction to pinch the rectangular substrate accommodated in the cassette C1 or the cassette C2 by the pinching portion 210. When the carry-out means 21 moves in the −Y-direction with the opening and closing members 250 being in the first open state, the rectangular substrate 5 slides on the bottom portions 250a of the opening and closing members 250 along with the protective tape T affixed to the back of the rectangular substrate 5. When the rectangular substrate 5 moves to a position directly above the chuck table 22, the movement of the carry-out means 21 is stopped, and the pinched state of the rectangular substrate 5 by the pinching portion 210 is released, whereupon the rectangular substrate 5 is placed on the two bottom portions 250a. Then, the opening and closing members 250 approach each other to form a closed state, whereby the posture of the rectangular substrate 5 is corrected.

Directly above the chuck table 22, a first transport means 26 is disposed. The first transport means 26 is furnished with a holding portion 260 having a plurality of attraction pads 260a fixed to a lower portion thereof, the attraction pads 260a communicating with a suction source (not shown). When the rectangular substrate 5 is placed on the bottom portions 250a, the holding portion 260 descends to attract the face of the rectangular substrate 5 by the attraction pads 260a. After the two opening and closing members 250 are brought into the first open state, the holding portion 260 ascends, while attracting the rectangular substrate 5, to hoist the rectangular substrate 5. Then, the two opening and closing members 250 are brought into the second open state, and the holding portion 260 is lowered to place the rectangular substrate 5 on the chuck table 22, whereafter the attraction of the rectangular substrate 5 by the attraction pads 260a is released. By so doing, the protective tape T affixed to the back of the rectangular substrate 5 is sucked and held by the chuck table 22, and the rectangular substrate 5 is also held by the chuck table 22.

The chuck table 22 is rotatable and movable in the X-axis direction, and an alignment means 27 for detecting the scheduled-separation lines 50 (see FIG. 2) formed on the rectangular substrate 5 is disposed above the moving path of the chuck table 22. When the rectangular substrate 5 is held on the chuck table 22, the chuck table 22 is moved in the +X-direction, whereby the rectangular substrate 5 is positioned directly below the alignment means 27. The alignment means 27 is equipped with an imaging portion 270, and detects the scheduled-separation line 50, for example, by pattern matching of an image, which the imaging portion 270 has obtained while moving in the Y-axis direction, to a prestored image.

As shown in FIG. 1, the cutting means 23, which has a cutting blade 230 rotating at a high speed and is movable in the Y-axis direction and the Z-axis direction, is disposed in the +X-direction with respect to the alignment means 27. The cutting means 23 is formed integrally with the imaging portion 270, and the cutting blade 230 is located on an extension, in the +X-direction, of the imaging portion 270. When the scheduled-separation line is detected by the alignment means 27, the alignment, in the Y-axis direction, of the scheduled-separation line 50 and the cutting blade 230 is performed automatically.

In this manner, the alignment, in the Y-axis direction, of the scheduled-separation line 50 to be cut and the cutting blade 230 is carried out. Then, the rectangular substrate 5 held on the chuck table 22 moves in the +X-direction, and the cutting means 23 lowers while the cutting blade 230 is rotating at a high speed. The cutting blade 230 rotating at a high speed cuts into the detected scheduled-separation line 50, whereby the scheduled-separation line 50 is cut to divide the rectangular substrate 5. The chuck table 22 reciprocates in the X-axis direction, and the cutting means 23 is indexed in the Y-axis direction by one width between the adjacent scheduled-separation lines 50. When, in this state, the scheduled-separation lines 50 are cut sequentially, the scheduled-separation lines 50 in the same direction are all cut to divide the rectangular substrate 5. Further, the chuck table 22 is rotated 90 degrees to rotate the rectangular substrate 5 through 90 degrees. Then, cutting is performed in the same manner as described above, whereby all the scheduled-separation lines 50 are cut to divide the rectangular substrate 5 into individual devices. After the rectangular substrate is separated into the devices, the chuck table 22 returns to its original position (hereinafter referred to as "mounting/dismounting position") shown in FIGS. 1 and 3.

Figure 4:
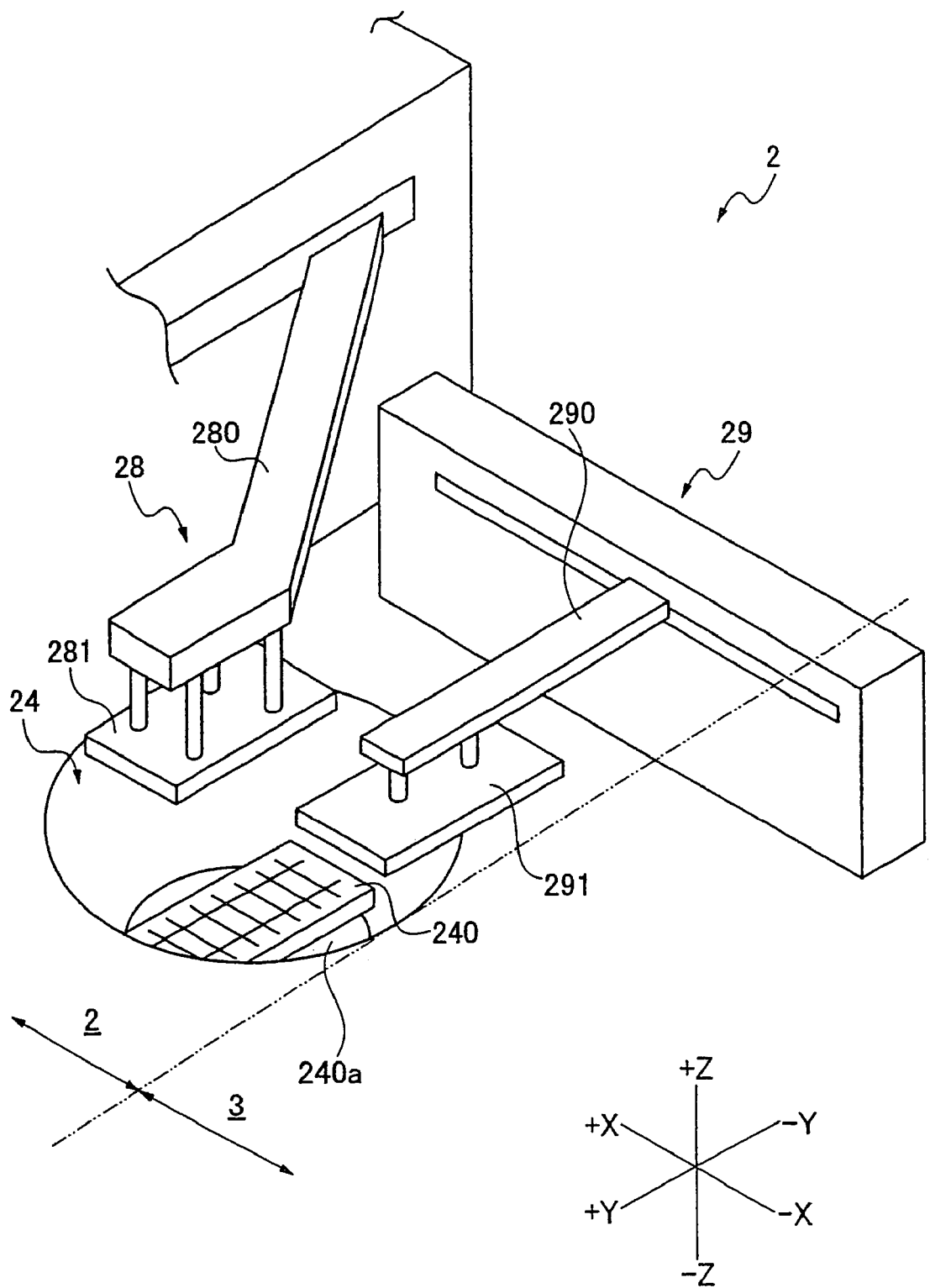
FIG. 4 is a perspective view showing a portion of the cutting-responsible region.

As shown, enlarged, in FIG. 4, a second transport means 28 for transporting the cut rectangular substrate to the cleaning means 24 is disposed above the cleaning means 24. The second transport means 28 is composed of an arm portion 280 movable in the Y-axis direction, and an attraction plate 281 mounted to a front end portion of the arm portion 280 in such a manner as to be capable of ascent and descent. When the rectangular substrate 5, which has been held on the chuck table 22 shown in FIGS. 1 and 3 and divided into the individual devices, returns to the mounting/dismounting position, suction of the rectangular substrate 5 is released, and the attraction plate 281 constituting the second transport means 28 descends to attract the rectangular substrate 5. In this state, the arm portion 280 moves in the −Y-direction, whereupon the rectangular substrate 5 moves to a position directly above the cleaning means 24. On this occasion, the opening and closing members 250 are in the second open state to permit the ascent and descent of the attraction plate 281.

The cleaning means 24 is furnished with a spinner table 240, which is fixed to the upper surface of a rotating base 240a, adapted to hold a material to be cleaned, and designed to be rotatable, a cleaning water nozzle (not shown) for ejecting cleaning water, and an air nozzle (not shown) for ejecting air. When the cut rectangular substrate 5 moves to a position directly above the cleaning means 24, the attraction plate 281 descends to place the rectangular substrate 5 on the spinner table 240. Upon release of attraction, the rectangular substrate 5 rests on the spinner table 240. Cleaning water is ejected from the cleaning water nozzle toward the rectangular substrate 5 held on the rotating spinner table 240 to remove swarf. After cleaning of the rectangular substrate 5 is completed, air is ejected from the air nozzle to remove cleaning water and dry the rectangular substrate 5.

In the cutting-responsible region 2, a third transport means 29, which comprises an arm portion 290 movable in the X-axis direction, and an attraction plate 291 mounted to a front end portion of the arm portion 290 so as to be capable of ascent and descent, is disposed in the vicinity (in the −Y-direction in the example of FIG. 4) of the cleaning means 24. After cleaning of the rectangular substrate 5, the attraction plate 291 constituting the third transport means 29 is positioned directly above the rectangular substrate 5, whereafter the attraction plate 291 descends to attract the face of the rectangular substrate 5. The attraction plate 291 ascends while attracting the rectangular substrate 5, and the arm portion 290 moves in the X-direction, whereby the rectangular substrate 5 is carried out of the cleaning means 24, and moved from the cutting-responsible region 2 toward the tape peeling-responsible region 3.

Figure 5:
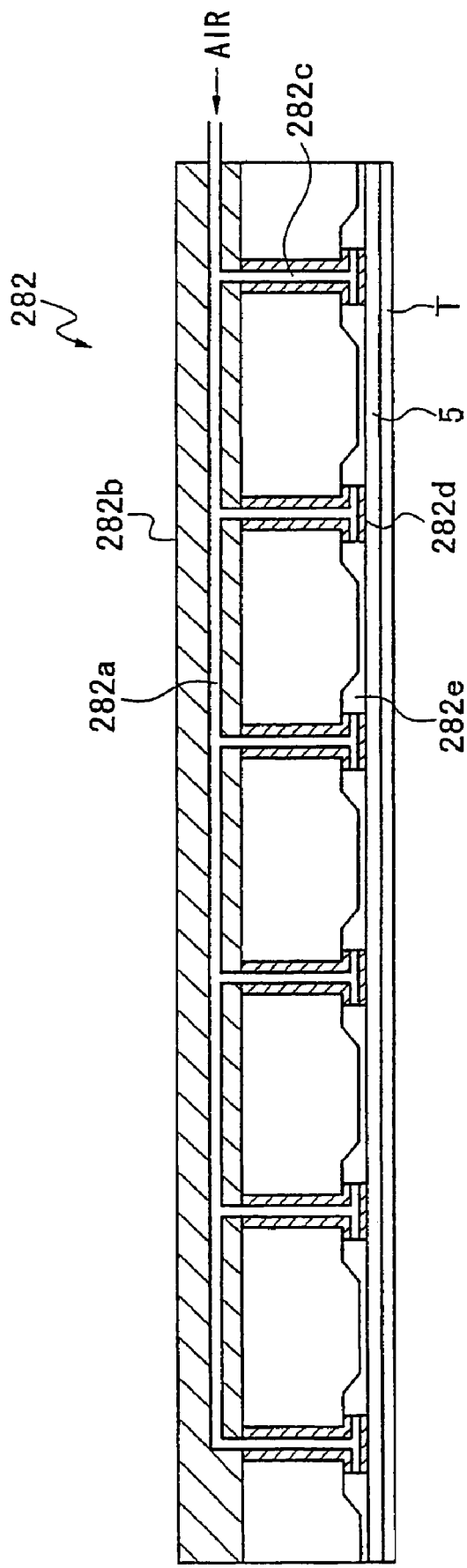
FIG. 5 is a sectional view showing an example of a Bernoulli pad for holding the rectangular substrate.

A Bernoulli pad 282 shown in FIG. 5 can be used as the attraction plate 281 constituting the second transport means 28 and the attraction plate 291 constituting the third transport means 29 shown in FIG. 4. The Bernoulli pad 282 can hold the rectangular substrate 5 by a negative pressure produced by ejecting air in a conical form.

The Bernoulli pad 282 is provided with a body portion 282b having an air channel 282a formed inside, and a contact holding member 282d having a nozzle portion 282c formed therein, the nozzle portion 282c communicating with the air channel 282a. Air supplied from the outside to the air channel 282a passes through the nozzle portion 282c, and is ejected from a side surface of a front end portion of the contact holding member 282d. An elastic member, such as a rubber pad, is used as the contact holding member 282d.

When the rectangular substrate 5 approaches, with air being ejected by such a structure, the rectangular substrate 5 is attracted by a negative pressure produced by a negative pressure producing portion 282e, and is thereby held. At this time, the contact holding member 282d contacts the rectangular substrate 5, so that even the rectangular substrate 5 having grooves formed therein by cutting can be stably held by the contact holding member 282d.

Figure 6:
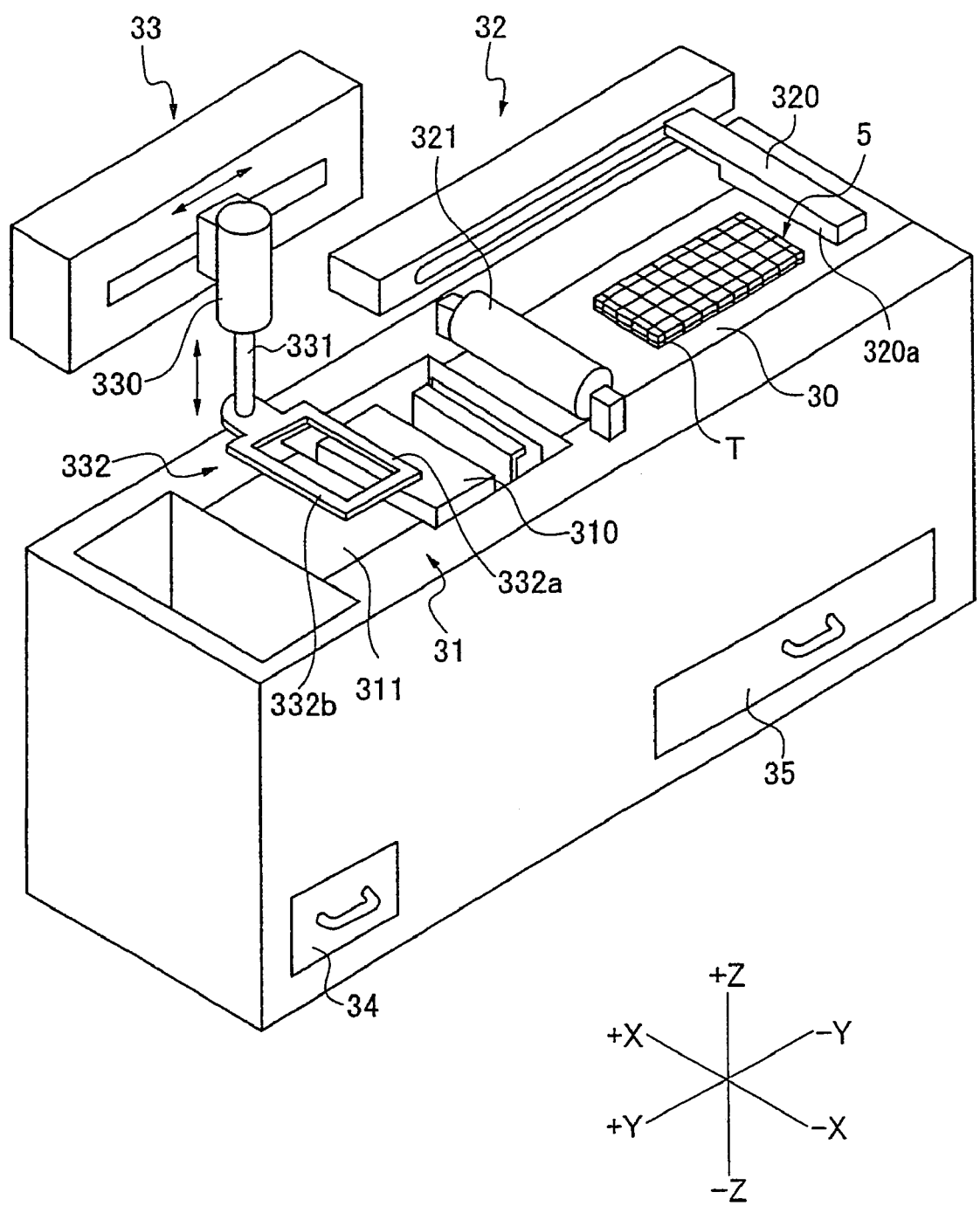
FIG. 6 is a perspective view showing a tape peeling-responsible region.

As shown, enlarged, in FIG. 6, the tape peeling-responsible region 3 is furnished with a temporary placement table 30 for temporarily bearing the rectangular substrate 5 cut and cleaned in the cutting-responsible region 2, a pickup table 31 where the device is placed and picked up, and a device transfer means 32 for transferring the device from the temporary placement table 30 to the pickup table 31 while peeling the protective tape T affixed to the back of the rectangular substrate 5.

A pusher 320 for moving the cut rectangular substrate 5, which has the protective tape T affixed thereto, in the +Y-direction is disposed above the temporary placement table 30. The arm-shaped pusher 320 is adapted to extend its front end in the X-axis direction and be capable of reciprocating in the Y-axis direction, and can push the rectangular substrate 5 by a side surface 320a of the pusher 320. A press roller 321 is disposed in the +Y-direction with respect to the pusher 320, and the press roller 320 is placed such that its axis is pointed in the X-axis direction. The press roller 321 can press, from above, the rectangular substrate 5 placed on the temporary placement table 30, and sandwich the rectangular substrate 5 between it and the temporary placement table 30.

In the illustrated example, the pickup table 31 is composed of a first table 310 and a second table 311 having table surfaces located at the same or nearly the same height. The first table 310 is disposed to be movable in the Y-axis direction in a region between the temporary placement table 30 and the second table 311, and can approach the temporary placement table 30 or the second table 311. The second table 311 is disposed at a predetermined distance from the temporary placement table 30. A device moving means 33 for moving the device placed on the first table 310 to the second table 311 is disposed above the pickup table 31. An end material accommodation portion 34 for accommodating the end materials present on the outer periphery of the diced rectangular substrate is disposed in the +Y direction with respect to the second table 311 and downwardly of the second table 311. A protective tape accommodation portion 35 for accommodating the protective tape to be discarded is disposed below the temporary placement table 30.

The device moving means 33 is furnished with a horizontally moving portion 330 horizontally moving in the Y-axis direction, a rod-shaped ascending and descending portion 331 supported by the horizontally moving portion 330 so as to be capable of ascending and descending in the Z-axis direction, and a push-out portion 332 fixed to the front end of the ascending and descending portion 331 for sliding the device and the end materials on the first table 310 or the second table 311 to push them out in the +Y-direction. The push-out portion 332 has a device push-out portion 332a for pushing out the device placed on the first table 310 in the +Y-direction and moving it to the second table 311, and an end material push-out portion 332b for discarding the end materials remaining on the second table 311 into the end material accommodation portion 34. In the illustrated example, the push-out portion 332 protrudes horizontally from a lower end portion of the ascending and descending portion 331 in the −X-direction, and is formed in a quadrilateral frame shape having an opening central portion. The push-out portion 332 has one side in the −Y-direction forming the device push-out portion 332a, and has one side in the +Y-direction, opposed to the device push-out portion 332a, forming the end material push-out portion 332b.

Figure 7:
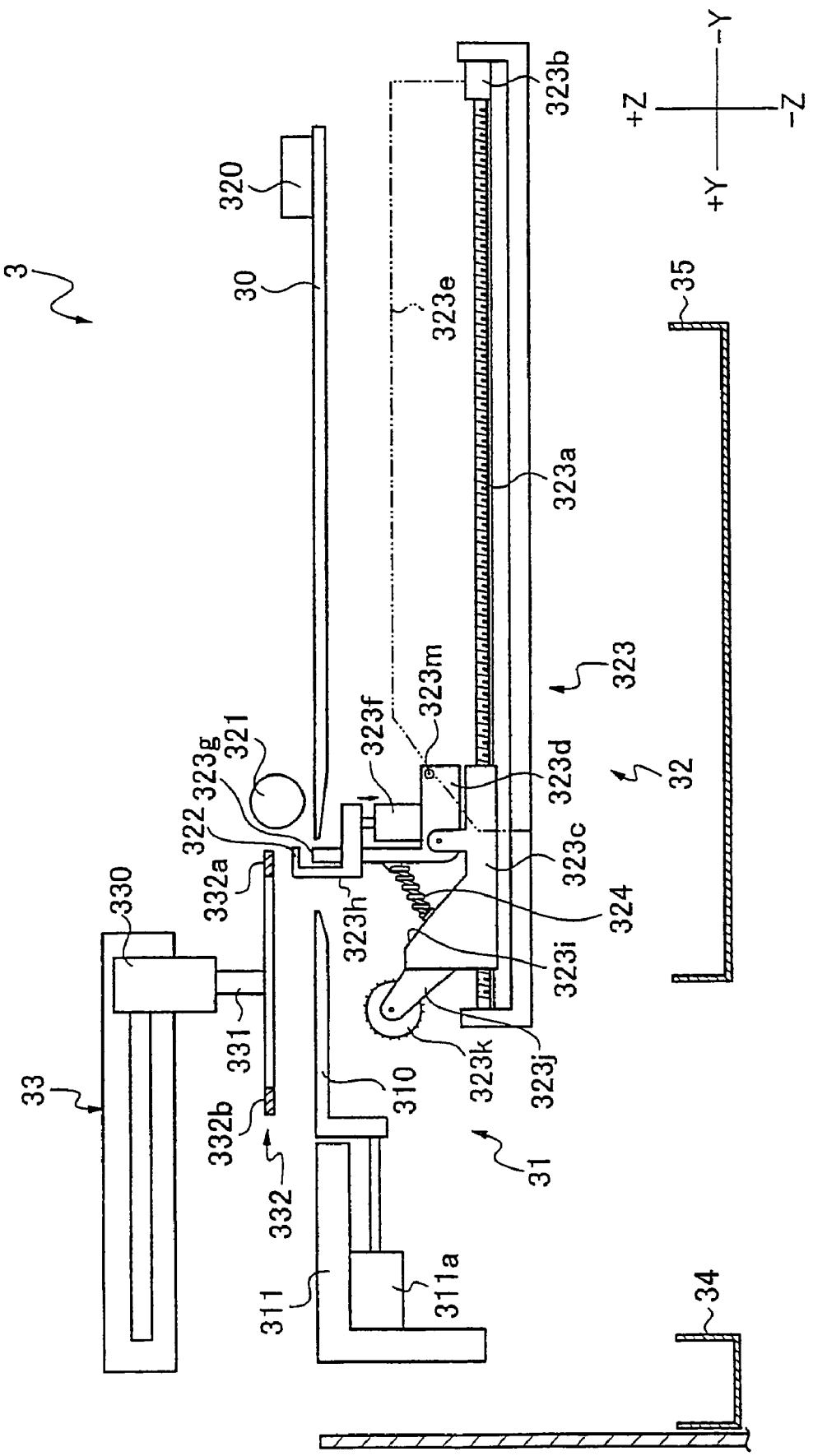
FIG. 7 is a schematic sectional view showing the internal structure of the tape peeling-responsible region.

As shown in FIG. 7, a gripping portion 322 capable of gripping an unnecessary end portion of the rectangular substrate 5 is disposed between the temporary placement table 30 and the first table 310. The gripping portion 322 can be lowered to a site below the temporary placement table 30 by a gripping portion drive portion 323 disposed below the temporary placement table 30. The first table 310 can be moved in the Y-axis direction by a drive portion 311a fixed to a lower portion of the second table 311.

The gripping portion drive portion 323 in the example of FIG. 7 is composed of a ball screw 323a disposed in the Y-axis direction, a motor 323b for turning the ball screw 323a, a base portion 323c having an internal nut screwed on the ball screw 323a and moving in the Y-axis direction according to the turning of the ball screw 323a, a pivotal portion 323d pivotably supported by the base portion 323c, a guide member 323e for guiding a pivotal movement of the pivotal portion 323d, and a raising and lowering drive portion 323f fixed to the pivotal portion 323d for raising and lowering the gripping portion 322. An air piston, for example, can be used as the raising and lowering drive portion 323f.

The gripping portion 322 ascends to a space formed between the temporary placement table 30 and the first table 310, and can pinch the end portion of the rectangular substrate, which is placed on the temporary placement table 30, between the gripping portion 322 and an end face 323g of the pivotal portion 323d, together with the protective tape T. A compression spring 324 is interposed between an outer side surface 323h of the pivotal portion 323d and a slant surface 323i of the base portion 323c to urge the pivotal portion 323d to be erected in the normal state. A roller support portion 323j is fixed to the outer side surface of the base portion 323c to support a tape detaching roller 323d pivotally.

Figure 8:
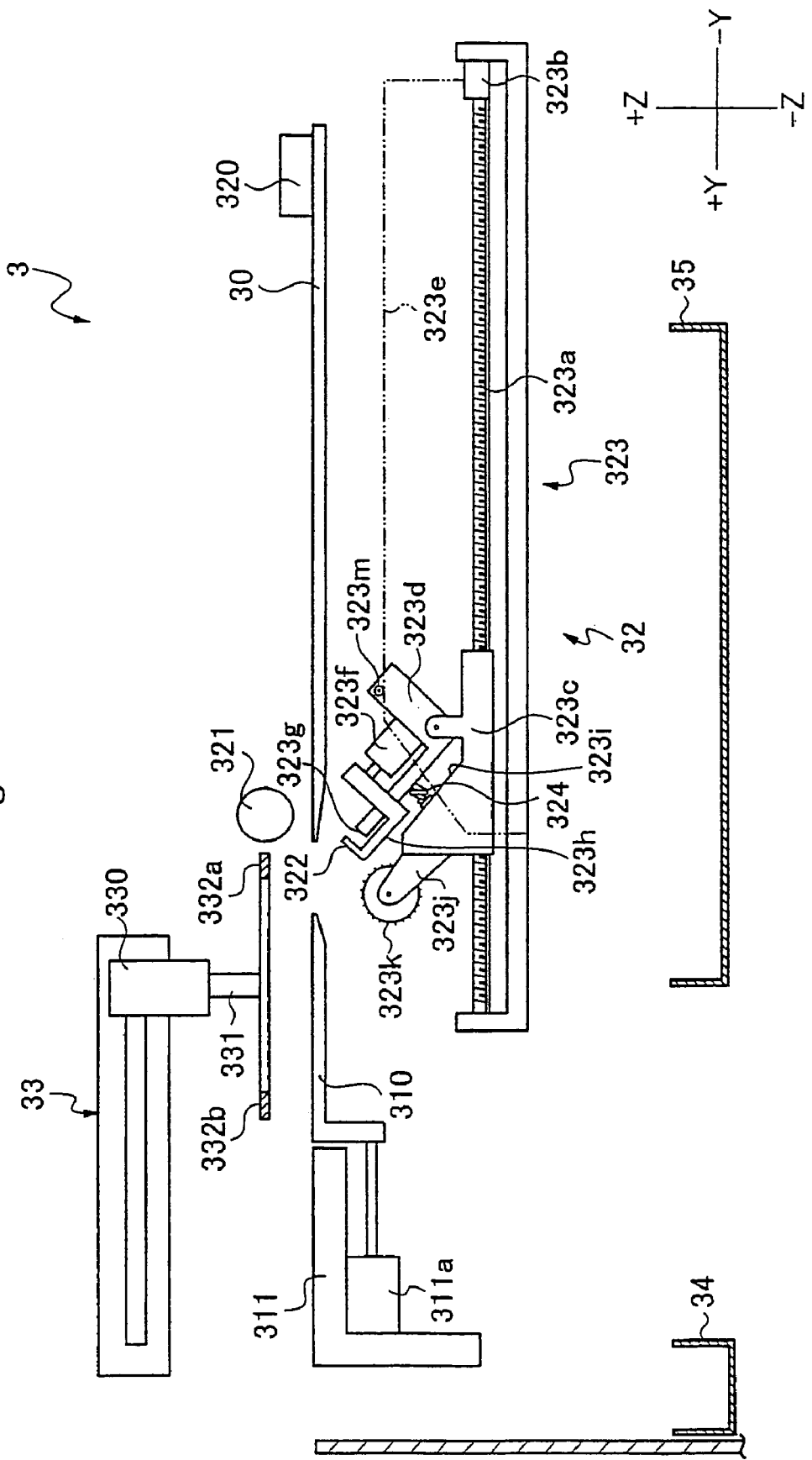
FIG. 8 is a schematic sectional view showing a state in which a pivotal portion is inclined in the internal structure.

The pivotal portion 323d is provided with a guide pin 323m extending in the X-axis direction, and the guide pin 323m is supported by the guide member 323e so as to be slidable on the guide member 323e. The guide member 323e has a slant surface and a horizontal surface, and turning of the ball screw 323a by driving of the motor 323b enables the pivotal portion 323d to move along the upper edge of the guide member 323e. When the base portion 323c moves in the −Y-direction, the guide pin 323m initially slides while ascending along the slant surface of the guide member 323e and, accordingly, the pivotal portion 323d becomes inclined while pivoting gradually counterclockwise. When the guide pin 323m slides on the horizontal surface of the guide member 323e, the pivotal portion 323d horizontally moves in the −Y-direction while maintaining an inclined state, as shown in FIG. 8.

Figure 9:
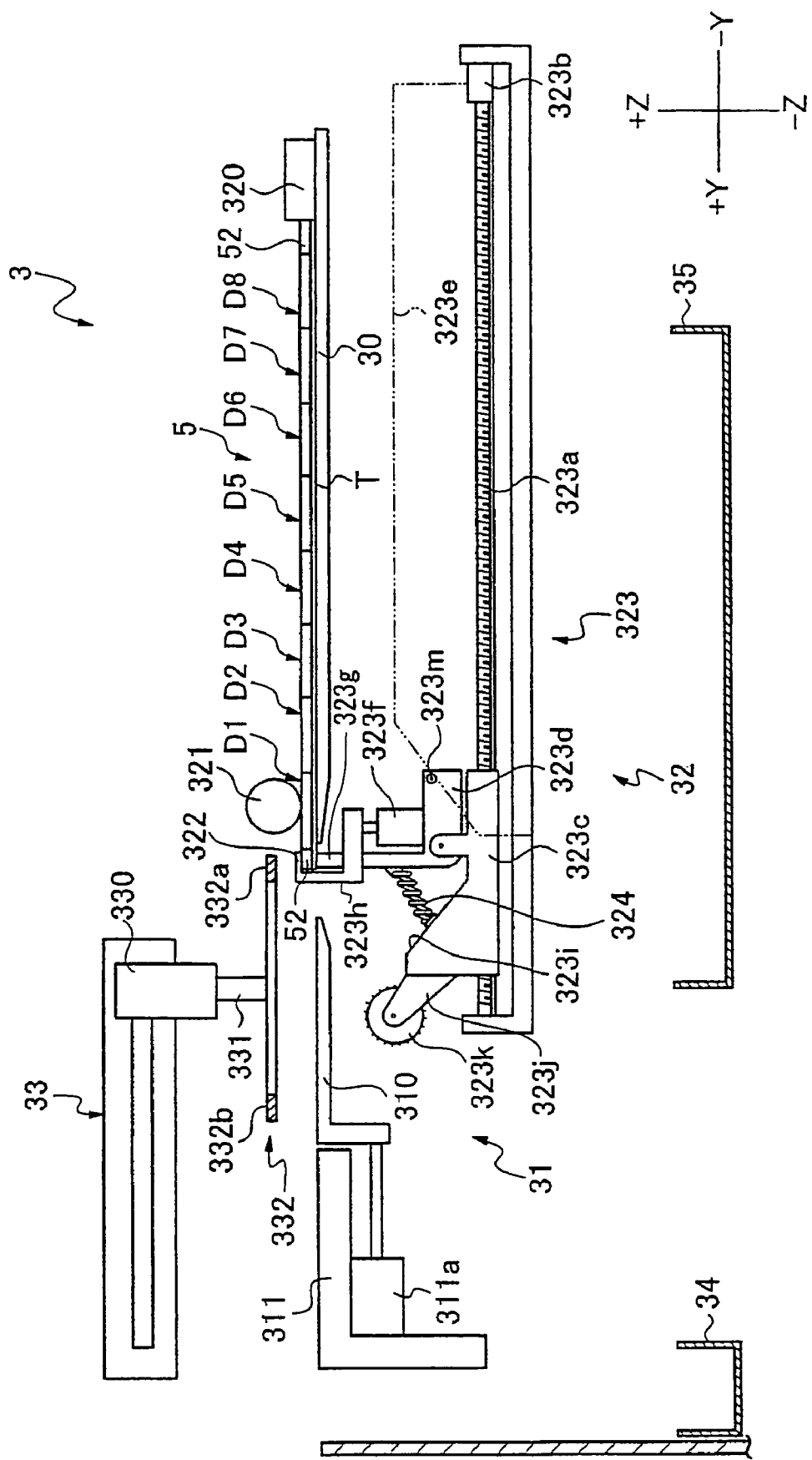
FIG. 9 is a schematic sectional view showing a state in which an unnecessary end portion of the rectangular substrate is pinched in the internal structure.

When the cut rectangular substrate 5 is placed on the temporary placement table 30 as shown in FIG. 6, the pusher 320 moves in the +Y-direction to move the rectangular substrate 5 in the +Y-direction and bring the rectangular substrate 5 between the press roller 321 and the temporary placement table 30, as shown in FIG. 9. When the rectangular substrate 5 is further pushed in the same direction by the pusher 320, the unnecessary end portion 52 on the outer periphery of the rectangular substrate 5 is pushed between the gripping portion 322 and the end face 323g of the pivotal portion 323d, together with the protective tape T, as shown in FIG. 9. The unnecessary end portion 52 is pinched, along with the protective tape T, by driving of the raising and lowering drive portion 323f.

Then, with the unnecessary end portion 52 being pinched by the gripping portion 322 and the end face 323g of the pivotal portion 323d together with the protective tape T, as shown in FIG. 9, the base portion 323c is moved in the −Y-direction by driving the motor 323b. By so doing, while the guide pin 323m is sliding on the inclined surface of the guide member 323e, the pivotal portion 323d gradually pivots counterclockwise and inclines. Since the first device row D1 adjacent to the unnecessary end portion 52 is pressed down by the press roller 321, only the unnecessary end portion 52 is pulled downward together with the protective tape T. At this time, the rectangular substrate 5 is pushed out in the +Y-direction by the pusher 320, and the protective tape T is pulled, whereby all the devices move in the +Y-direction on the temporary placement table 30.

Figure 10:
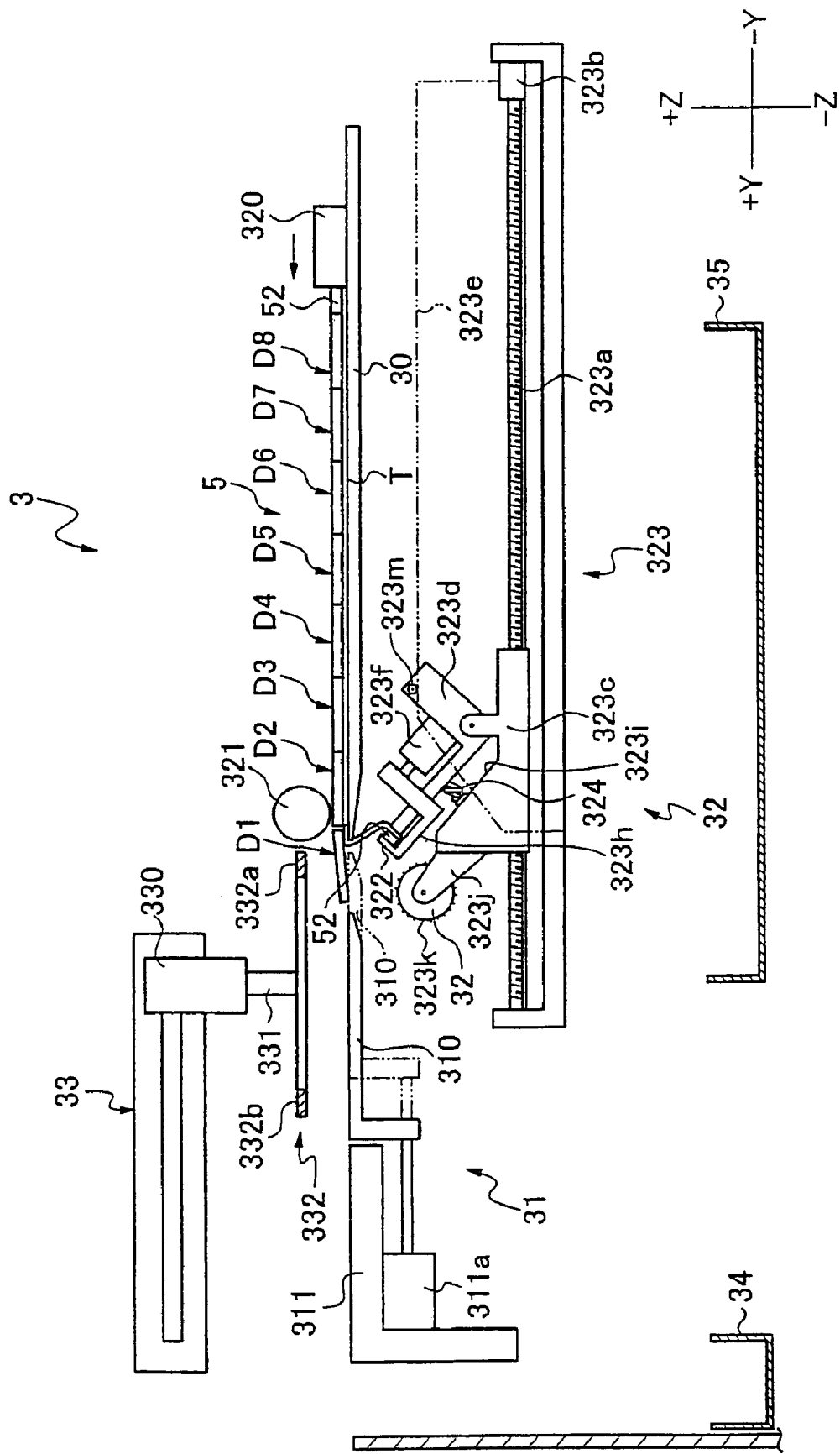
FIG. 10 is a schematic sectional view showing a state in which the pivotal portion inclines and horizontally moves while pinching the unnecessary end portion in the internal structure.
Figure 11:
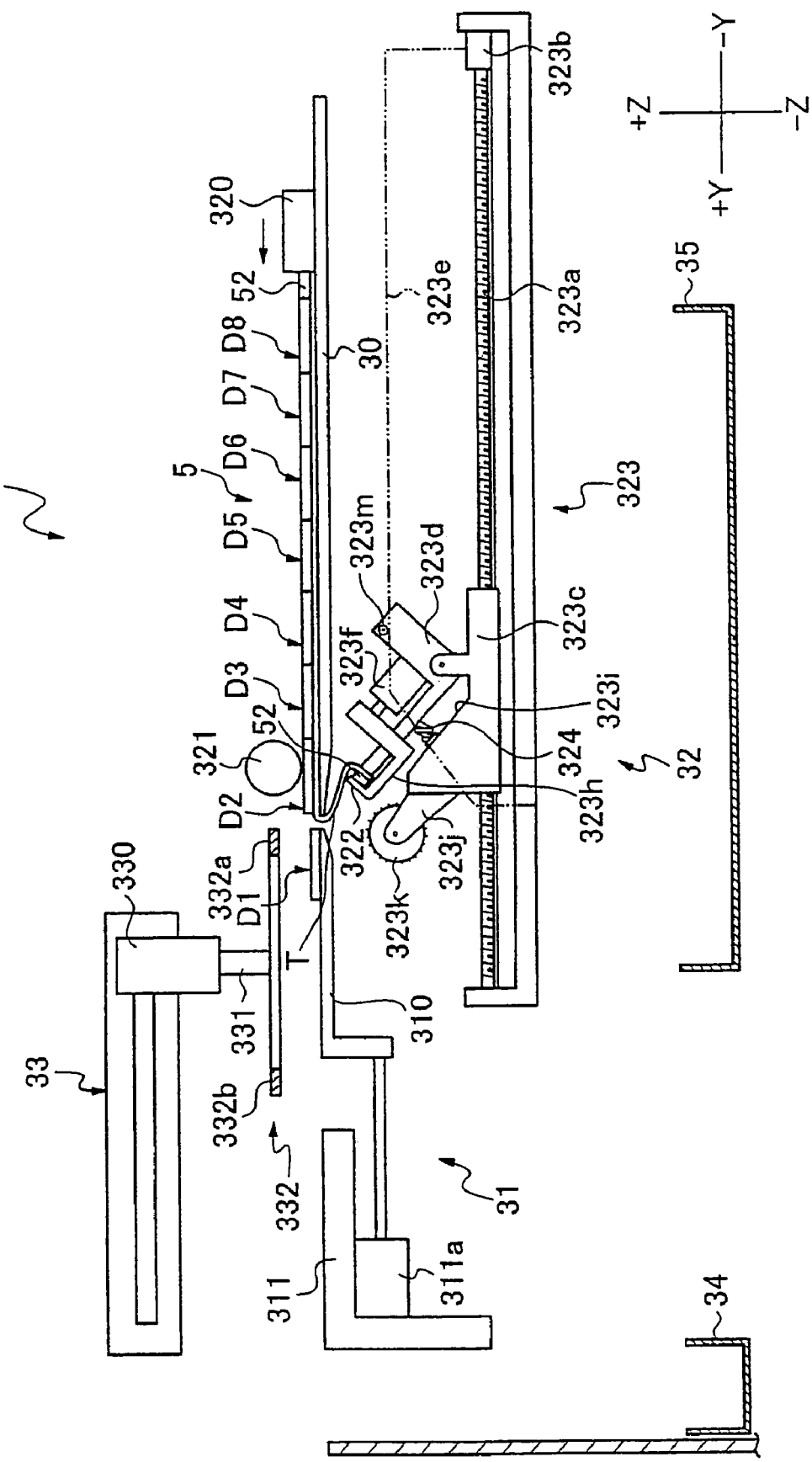
FIG. 11 is a schematic sectional view showing a state in which a first device row has been transferred to a first table in the internal structure.

In the meantime, the unnecessary end portion 52 lowers and comes downwardly of the temporary placement table 30, and the first device row D1 adjacent to the unnecessary end portion 52 moves to a site near the end portion of the temporary placement table 30. On this occasion, as shown by a double-dotted chain line in FIG. 10, the first table 310 approaches the temporary placement table 30, and comes close to the temporary placement table 30, leaving a slightly larger gap than the thickness of the protective tape T. When, in this state, the base portion 323c further moves in the −Y-direction, the protective tape T is pulled downward, whereas the first device row D1 adjacent to the unnecessary end portion 52 is transferred to the first table 310 without being pulled downward, as shown in FIG. 11. In this manner, only the first device row D1 is transferred to the first table 310.

Figure 12:
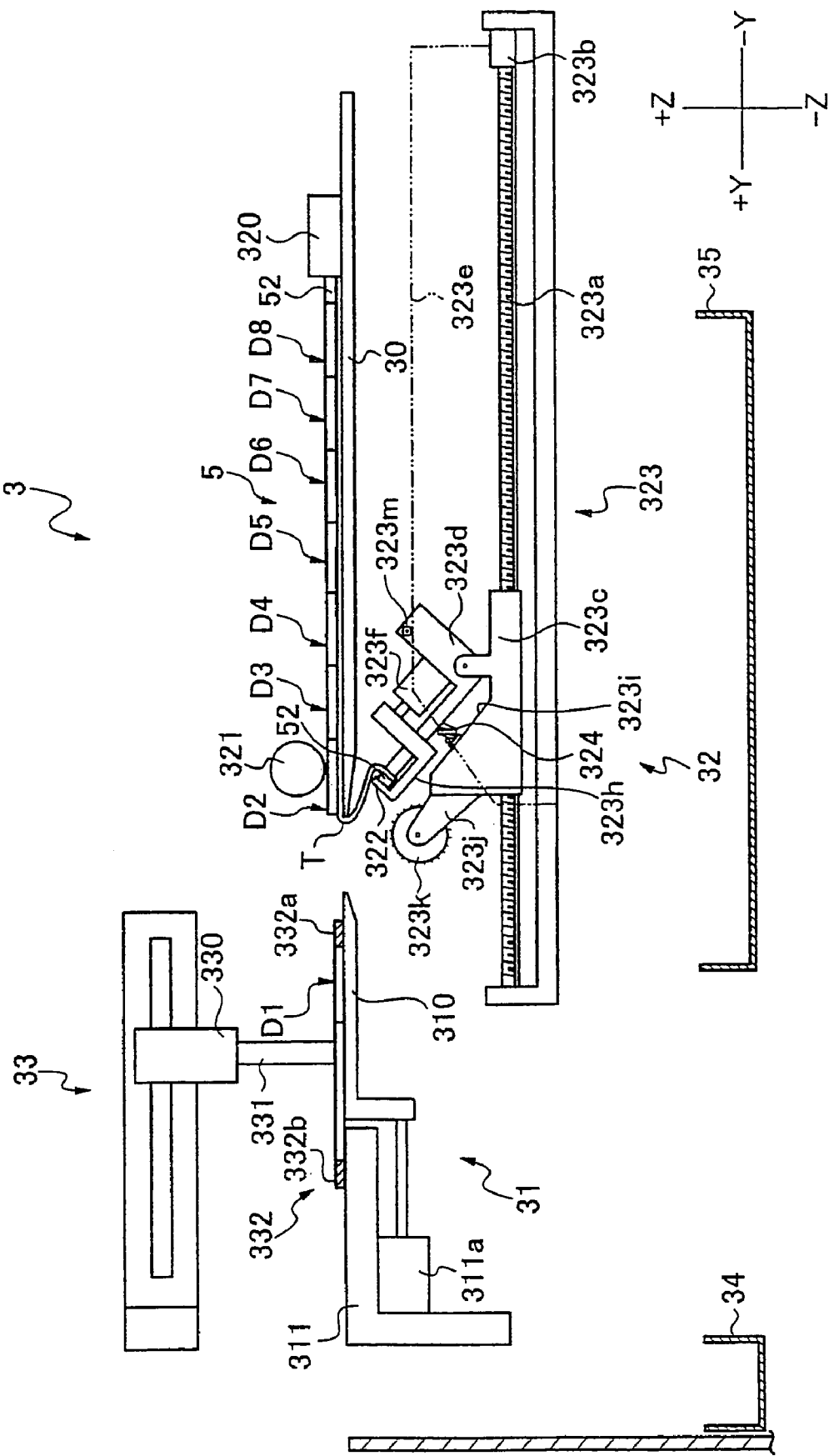
FIG. 12 is a schematic sectional view showing a process during which the first device row is moved to a second table in the internal structure.
Figure 13:
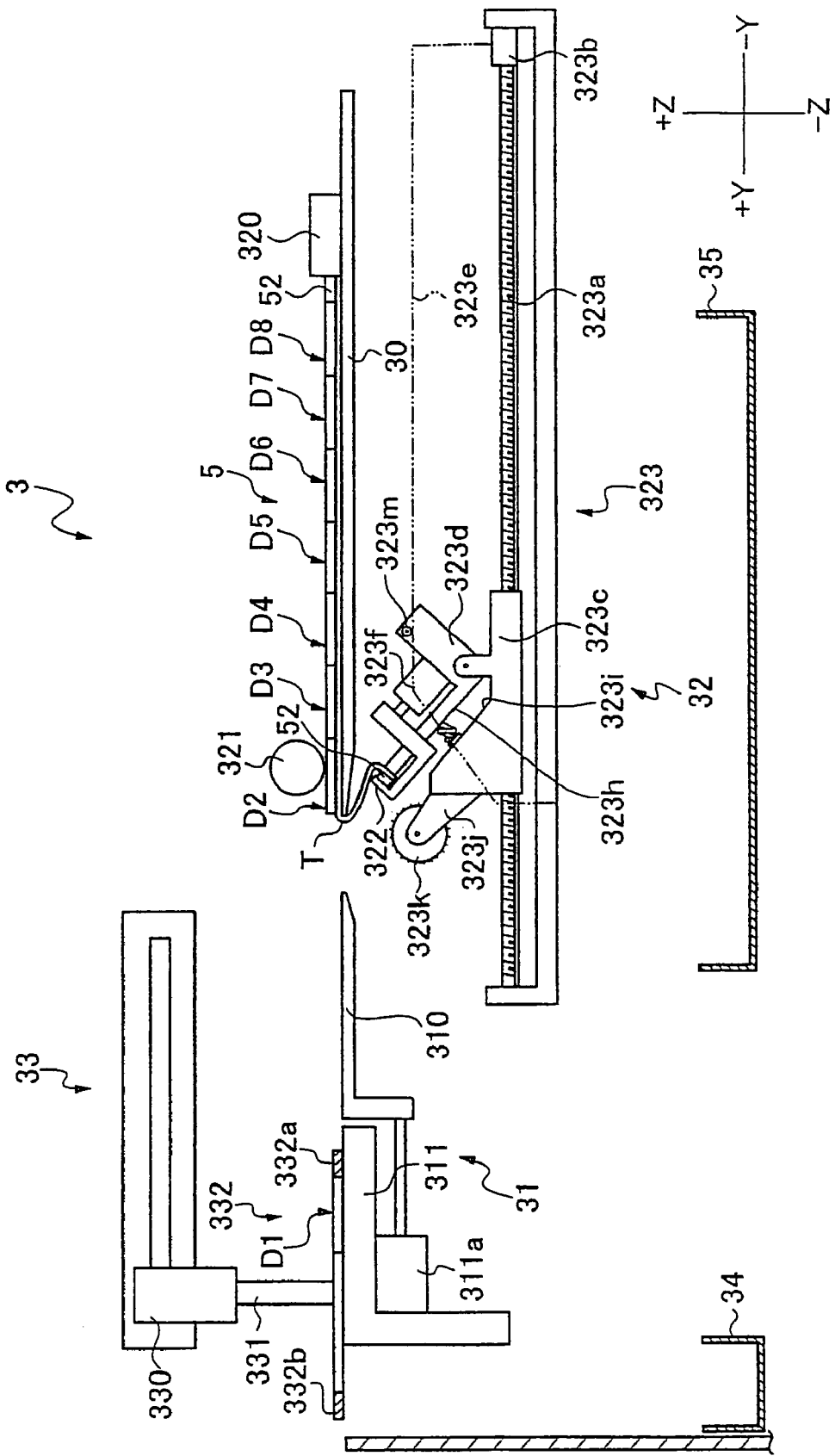
FIG. 13 is a schematic sectional view showing a state in which the first device row has been moved to the second table in the internal structure.

When the first device row D1 is transferred to the first table 310, the first table 310 moves in the +Y-direction and approaches the second table 311, as shown in FIG. 12. Then, the push-out portion 332 constituting the device moving means 33 descends, and the push-out portion 332 slides in the +Y-direction on the first table 310. By this motion, the push-out portion 332a constituting the push-out portion 332 pushes in the first device row D1 in the +Y direction and, as shown in FIG. 13, transfers the first device row D1 from the first table 310 to the second table 311. As noted above, the gripping portion 322, the press roller 321, the pusher 320, and the gripping portion drive portion 323 cooperate to constitute the device transfer means 32 for transferring the device row to the pickup table 31.

Figure 14:
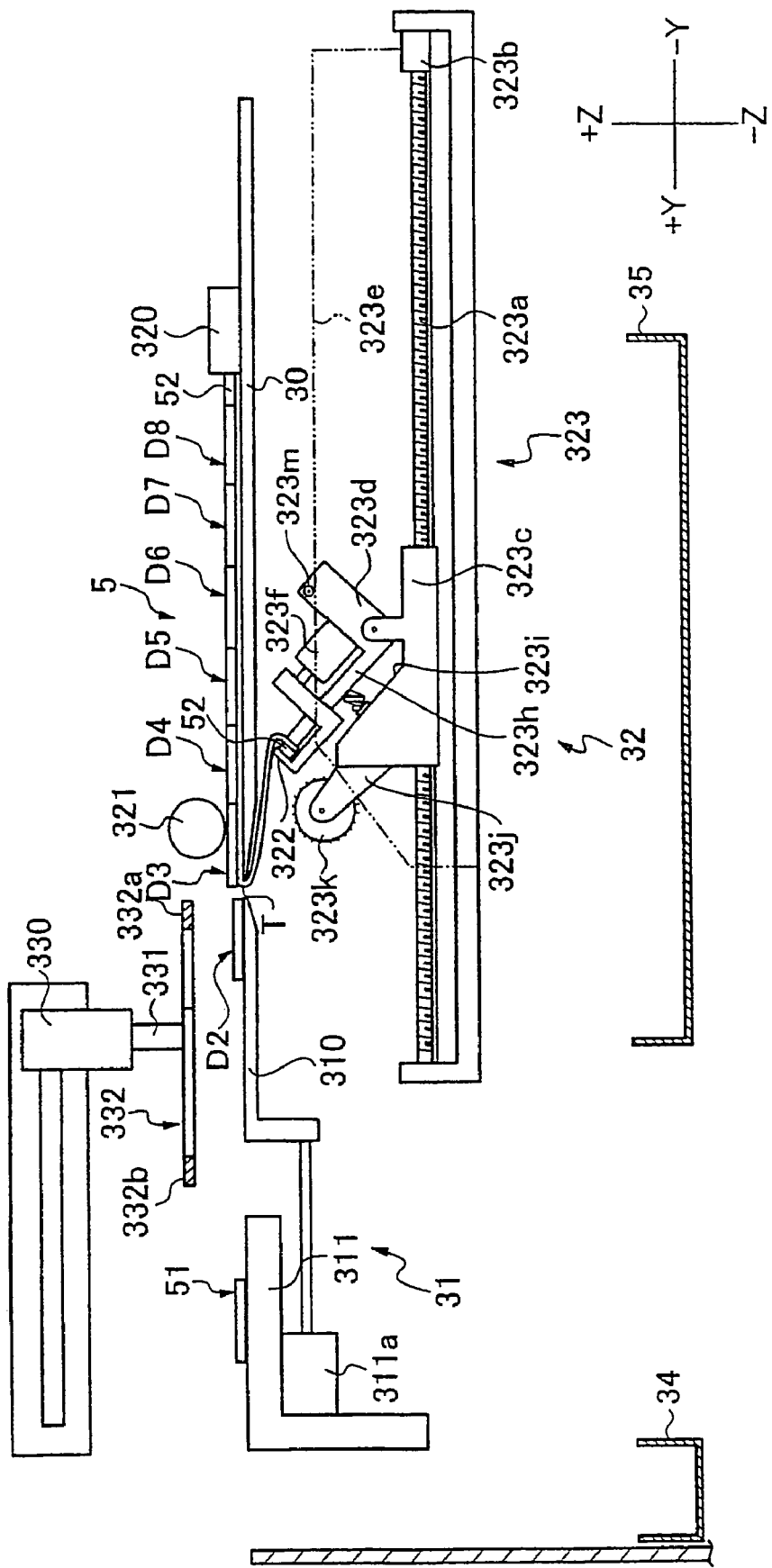
FIG. 14 is a schematic sectional view showing a state in which a second device row has been transferred to the first table in the internal structure.

When the first device row D1 is transferred to the second table 311, the devices constituting the first device row D1 transferred to the second table 311 are individually picked up and accommodated into the device case, as will be described later. Even after the devices are picked up, however, the end materials 51 shown in FIG. 2 are left, unchanged, on the second table 311. Then, as shown in FIG. 14, the first table 310 moves in the −Y-direction and approaches the temporary placement table 30. Then, the cut rectangular substrate 5 rid of the first device row D1 is further pushed in the +Y-direction by the pusher 320, and thereby slid. Also, the base portion 323*c* is further moved in the −Y-direction, whereby the second device row D2 is placed on the first table 310. Then, the second device row D2 is transferred to the second table 311, as in the same way as shown in FIGS. 12 and 13. On this occasion, the end materials 51 are accommodated into the end material accommodation portion 34 by the end material push-out portion 332*b* of the push-out portion 332.

Figure 15:
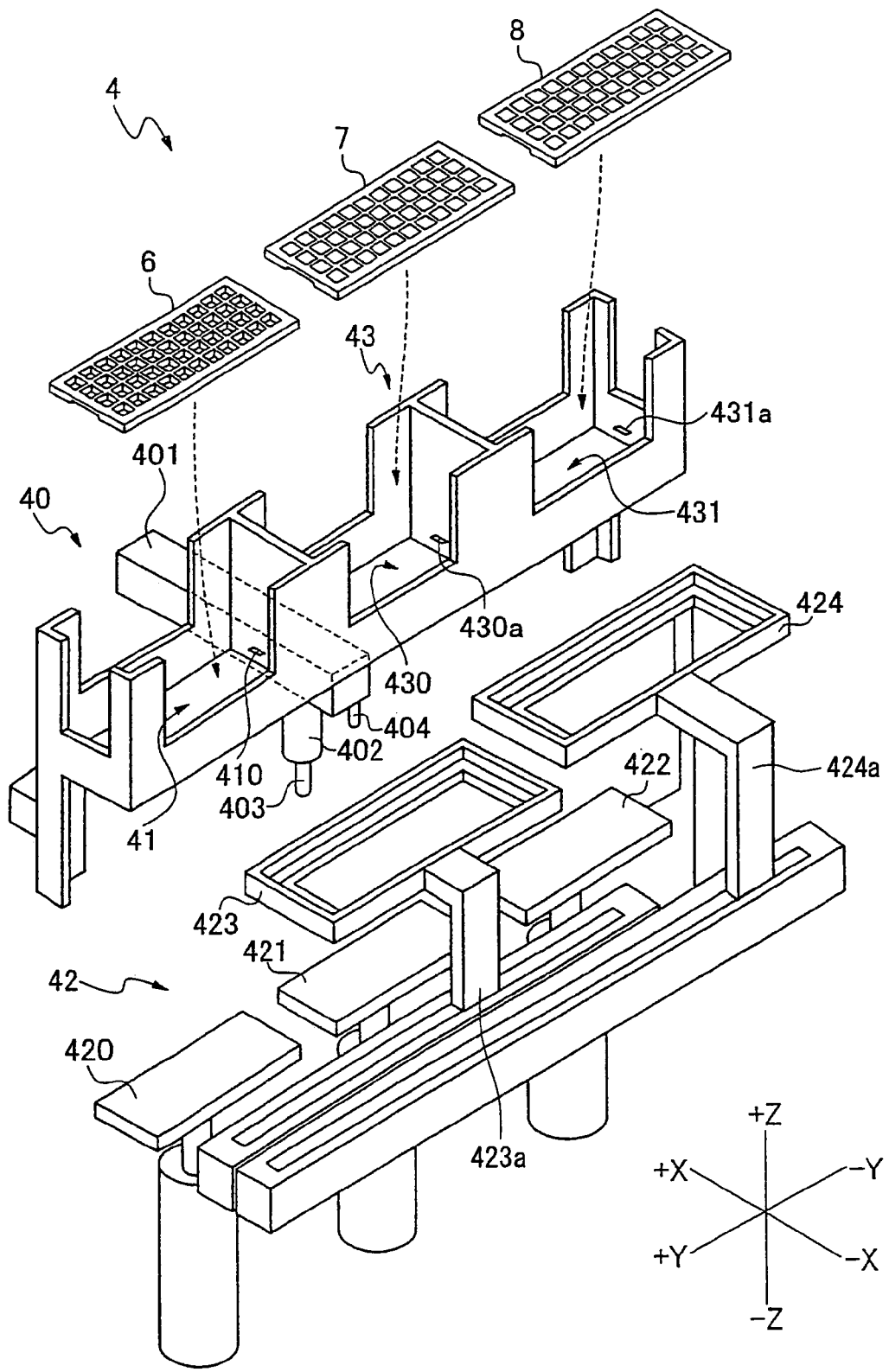
FIG. 15 is a perspective view showing a device accommodation-responsible region.

As shown, enlarged, in FIG. 15, the device accommodation-responsible region 4 is furnished, at least, with a pickup means 40 for picking up the device transferred to the pickup table and accommodating it into the device case, an empty device case storage portion 41 for storing an empty device case 6, a device case positioning means 42 for withdrawing the empty device case 6 from the empty device case storage portion 41 and bringing the device case to a device accommodation position which is a position where the device picked up by the pickup means 40 can be accommodated, and an accommodated device case storage portion 43 for storing the device case accommodating the device. In the illustrated example, the accommodated device case storage portion 43 is composed of an acceptable product device case storage portion 430 for storing an acceptable product device case 7 accommodating devices as acceptable products, and a defective product device case storage portion 431 for storing a defective product device case 8 accommodating devices as defective products. The empty device case storage portion 41, the acceptable product device case storage portion 430, and the defective product device case storage portion 431 can each store a plurality of the device cases stacked in the vertical direction.

In the pickup means 40, a support portion 402 on the lower surface of a support portion 401 is disposed to be movable in the X-axis direction, and the support portion 402 supports an attraction portion 403 such that the attraction portion 403 can be raised and lowered. A determination portion 404 for imaging the device and determining whether it is an acceptable product or a device product is provided at the lower surface of the support portion 401.

Directly below the empty device case storage portion 41, the acceptable product device case storage portion 430, and the defective product device case storage portion 431, a first ascending and descending plate 420, a second ascending and descending plate 421, and a third ascending and descending plate 422 are disposed side by side in the Y-axis direction. The device cases can be placed on the first ascending and descending plate 420, the second ascending and descending plate 421, and the third ascending and descending plate 422. Above the first ascending and descending plate 420, the second ascending and descending plate 421, and the third ascending and descending plate 422, a first case frame 423 and a second case frame 424, which can move parallel in the Y-axis direction, are disposed parallel in the Y-axis direction. The first case frame 423 and the second case frame 424, each of a quadrilateral shape, are different in height. That is, the first case frame 423 is supported by a support arm 423*a* of an inverted L-shape having a small height, while the second case frame 424 is supported by a support arm 424*a* of an inverted L-shape having a large height, so that the second case frame 424 is located at a higher position than the first case frame 423. The first case frame 423 and the second case frame 424 are each movable in the Y-axis direction, and are arranged on the same straight line of the Y-axis. However, when the second case frame 424 is located in the −X-direction with respect to the first case frame 423, and the first case frame 423 and the second case frame 424 intersect, the first case frame 423 enters inwardly of the second case frame 424, and these case frames do not contact each other. The first ascending and descending plate 420, the second ascending and descending plate 421, the third ascending and descending plate 422, the first case frame 423, and the second case frame 424 act in an organized manner, thereby locating the device case at the device accommodation position, and constituting the device case positioning means 42.

Of the plural empty device cases 6 stored in the empty device case storage portion 41, the lowermost one is supported by first protruding pieces 410 and does not fall off. Thus, the device case placed above it is also supported. The first protruding pieces 410 are free to protrude from and retract into the side wall of the empty device case storage portion 41. When the first protruding pieces 410 retract, the supported state of the empty device case 6 is released. For the acceptable product device case storage portion 430 and the defective product device case storage portion 431 as well, second protruding pieces 430*a* and third protruding pieces 431*a* having the same function are disposed.

After the first device row D1 is placed on the second table 311 constituting the pickup table 31, as shown in FIG. 14, the empty device case stored at the lowest position in the empty device case storage portion 41 is withdrawn, and moved to the position where the device can be accommodated (i.e., device accommodation position). The following is an explanation for a case where two of the device cases are withdrawn from the empty device case storage portion 41, and one of them is used as an acceptable product device case, and the other is used as a defective product device case.

Figure 16:
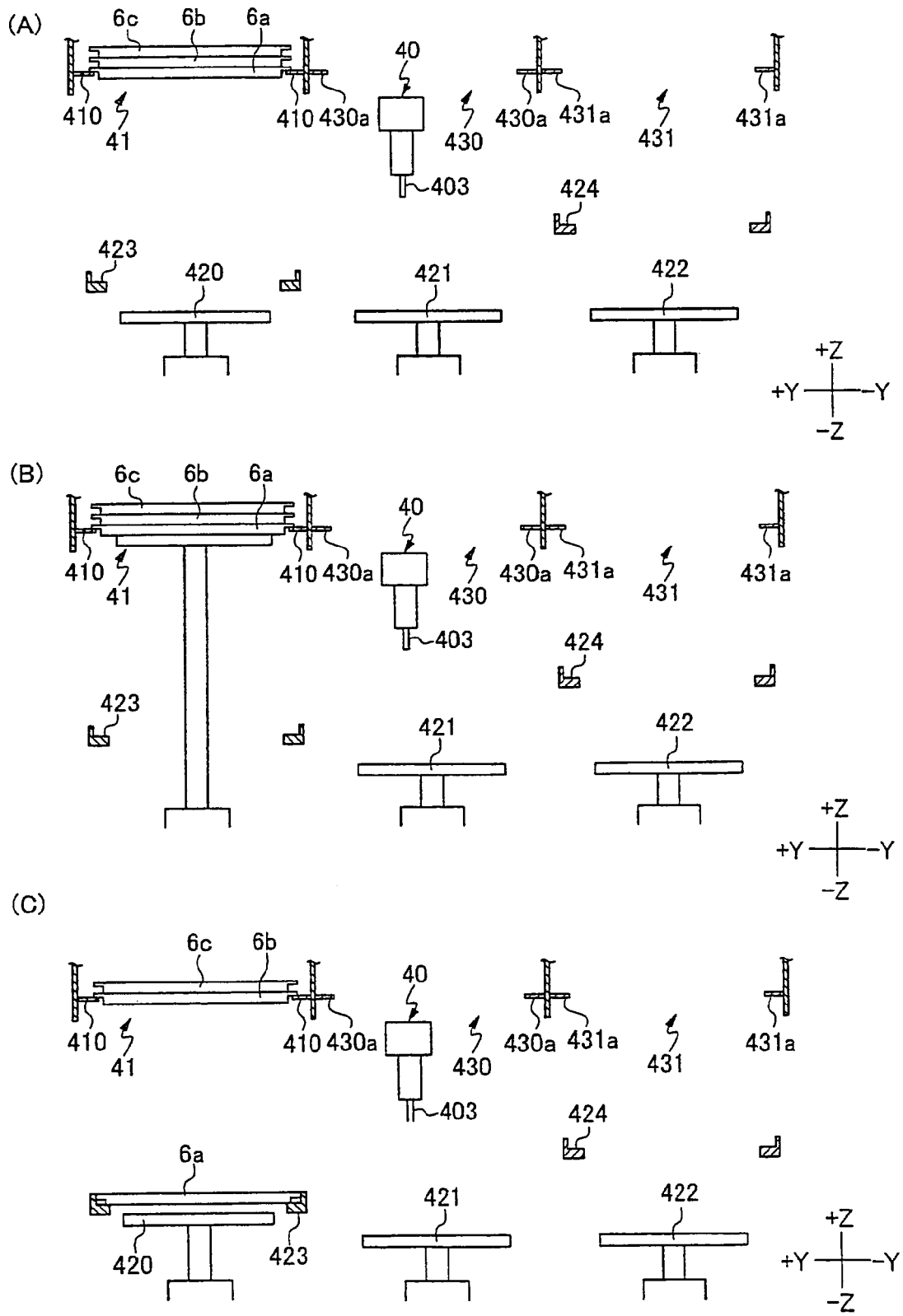
FIGS. 16(A) to 16(C) are schematic sectional views showing an example of an action for withdrawing an empty device case and using it as an acceptable product device case in the device accommodation-responsible region, FIG. 16(A) showing an initial state, FIG. 16(B) showing a state in which the empty device case is withdrawn from an empty device case storage portion, and FIG. 16(C) showing a state in which the withdrawn empty device case is accommodated in a first case frame.

First, as shown in FIG. 16(A), the first case frame 423 is positioned directly below the empty device case storage portion 41 and directly above the first ascending and descending plate 420. The first ascending and descending plate 420 is raised through the interior of the first case frame 423 and, as shown in FIG. 16(B), the first ascending and descending plate 420 is brought into close contact with the lower surface of the lowermost empty device case 6*a* to support the lowermost empty device case 6*a*, and the supported state by the first protruding piece 410 is released. When, in this state, the first ascending and descending plate 420 is lowered, the lowermost empty device case 6*a* is also lowered and can be withdrawn. When the first protruding pieces 410 are protruded to support the empty device case 6*b* directly above the lowermost empty device case 6*a*, and the first ascending and descending plate 420 is further lowered, the withdrawn empty device case 6*a* is accommodated into the first case frame 423, as shown in FIG. 16(C). In this manner, the empty device case 6*a* accommodated in the first case frame 423 serves as an acceptable product device case.

Figure 17:
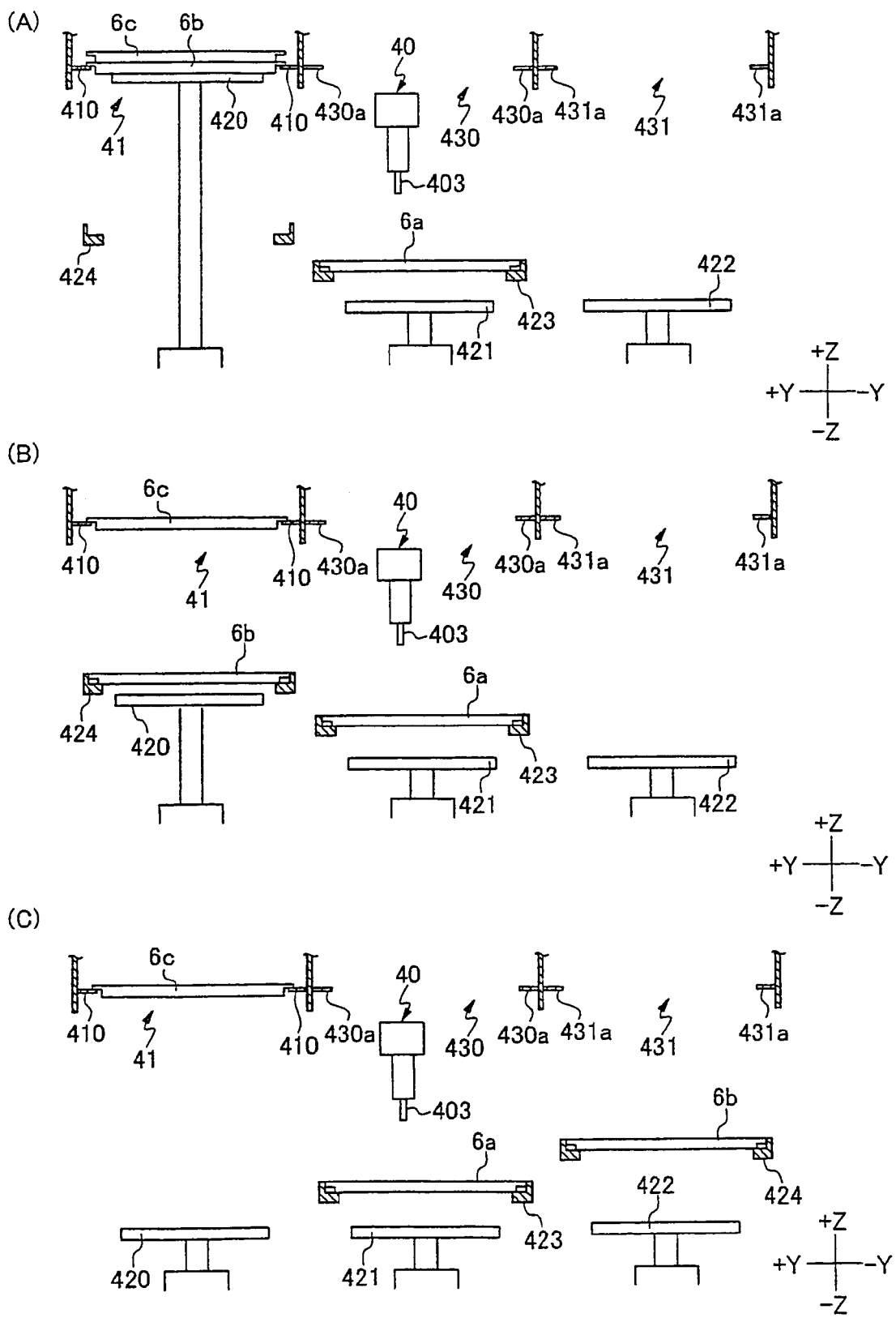
FIGS. 17(A) to 17(C) are schematic sectional views showing an example of an action for withdrawing an empty device case and using it as a defective product device case in the device accommodation-responsible region, FIG. 17(A) showing a state in which the empty device case is withdrawn from the empty device case storage portion, FIG. 17(B) showing a state in which the withdrawn empty device case is accommodated in a second case frame, and FIG. 17(C) showing a state in which the empty device case accommodated in the second case frame has been moved.

The first case frame 423 accommodating the empty device case 6*a* is moved in the Y-axis direction, whereby the empty device case 6*a* can be brought to the acceptable product device accommodation position. For example, as shown in FIG. 17(A), assume that the first case frame 423 is moved in the −Y-direction, and positioned directly below the acceptable product device case storage portion 430 and, at this position, the device is accommodated into the acceptable product device case 6*a*. In this case, this position is the acceptable product device accommodation position. As noted here, the first ascending and descending plate 420 and the first case frame 423 function as the acceptable product device case positioning means for withdrawing the empty device case from the empty device case storage portion 41, and bringing the empty device case, as the acceptable product device case, to the acceptable product device accommodation position which is the position where the device as the acceptable product is accommodated. The acceptable product device accommodation position is not limited to the position of the illustrated example, if it is a position to which the attraction portion 403 constituting the pickup means 40 is movable and which does not overlap the defective product device accommodation position to be described later.

A different empty device case 6b is withdrawn from the empty device case storage portion 41, and used as a defective product device case. The defective product device case is accommodated into the second case frame 424. As shown in FIG. 17(A), with the empty device case 6a being located at the acceptable product device accommodation position, the second case frame 424 is moved in the +Y-direction, and positioned directly below the empty device case storage portion 41. Then, the first ascending and descending plate 420 is raised to support the empty device case 6b. The first protruding pieces 410 are retracted to withdraw the lowermost empty device case 6b. When the first ascending and descending plate 420 is lowered, with the first ascending and descending plate 420 supporting the empty device case 6b, the empty device case 6b is accommodated into the second case frame 424, as shown in FIG. 17(B). In this manner, the empty device case 6b accommodated in the second case frame 424 serves as a defective product device case. Then, the second case frame 424 is moved in the −Y-direction, whereby the defective product device case 6b can be moved to a position where it does not overlap the acceptable product device case 6a, as shown in FIG. 17(C). In this state, the device as an acceptable product can be accommodated into the acceptable product device case 6a. As noted here, the first ascending and descending plate 420 and the second case frame 424 function as the defective product device case positioning means for withdrawing the empty device case from the empty device case storage portion 41, and bringing the empty device case, as the defective product device case, to the defective product device accommodation position which is the position where the device as the defective product is accommodated. The defective product device accommodation position may be a position to which the attraction portion 403 constituting the pickup means 40 is movable. The device accommodation position in the present example is directly above the acceptable product device accommodation position.

Figure 18:
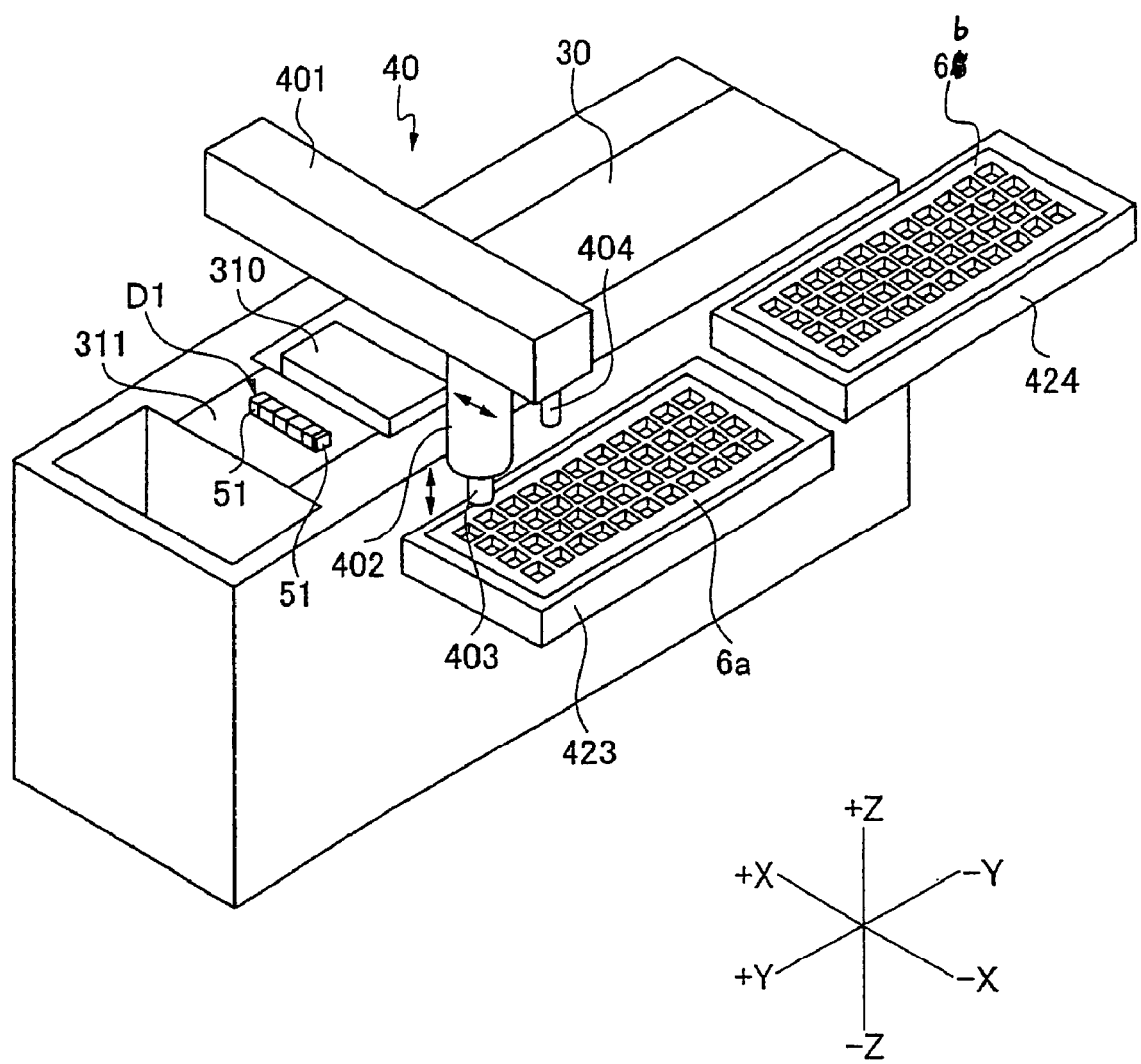
FIG. 18 is a perspective view showing the manner of accommodating devices into the acceptable product device case and the defective product device case.

When the acceptable product device case 6a is located at the acceptable product device accommodation position, the support portion 402 constituting the pickup means 40 moves in the +X-direction, and the attraction portion 403 lowers and attracts the devices, which constitute the first device row D1, one by one, as shown in FIG. 18. At this time, before attraction, the determination portion 404 images the device to determine whether the device is an acceptable product or a defective product. Determination of an acceptable product or a defective product with this timing does not decrease productivity. Two of the end materials 51 (see FIG. 2) are present at both ends of the first device row D1, and these end materials 51 are not picked up.

If it is determined that the device to be picked up is an acceptable product, the support portion 402 is moved in the −X-direction, with the attraction portion 403 attracting the device. The attracted device is positioned directly above a predetermined empty region of the acceptable product device case 6a, and the attraction portion 403 is lowered. At the same time, the attraction is released to accommodate the device, as an acceptable product, into the empty region. If it is determined that the device to be picked up is a defective product, on the other hand, the second case frame 424 moves in the +Y-direction to locate the defective product device case 6b at the defective product device accommodation position. Also, the support portion 402 moves in the −X-direction to position the attraction portion 403 directly above a predetermined empty region of the defective product device case 6b, and the attraction portion 403 is lowered. At the same time, the attraction is released to accommodate the device, as a defective product, into the empty region. The acceptable product device case 6a and the defective product device case 6b are moved in the Y-axis direction, as appropriate, depending on the situation of accommodation of the devices in the empty regions. In this manner, the individual devices constituting the first device row D1 are accommodated, one after another, into either the acceptable product device case 6a or the defective product device case 6b. The pickup means 40 may be adapted to be movable in the Y-axis direction.

Figure 19:
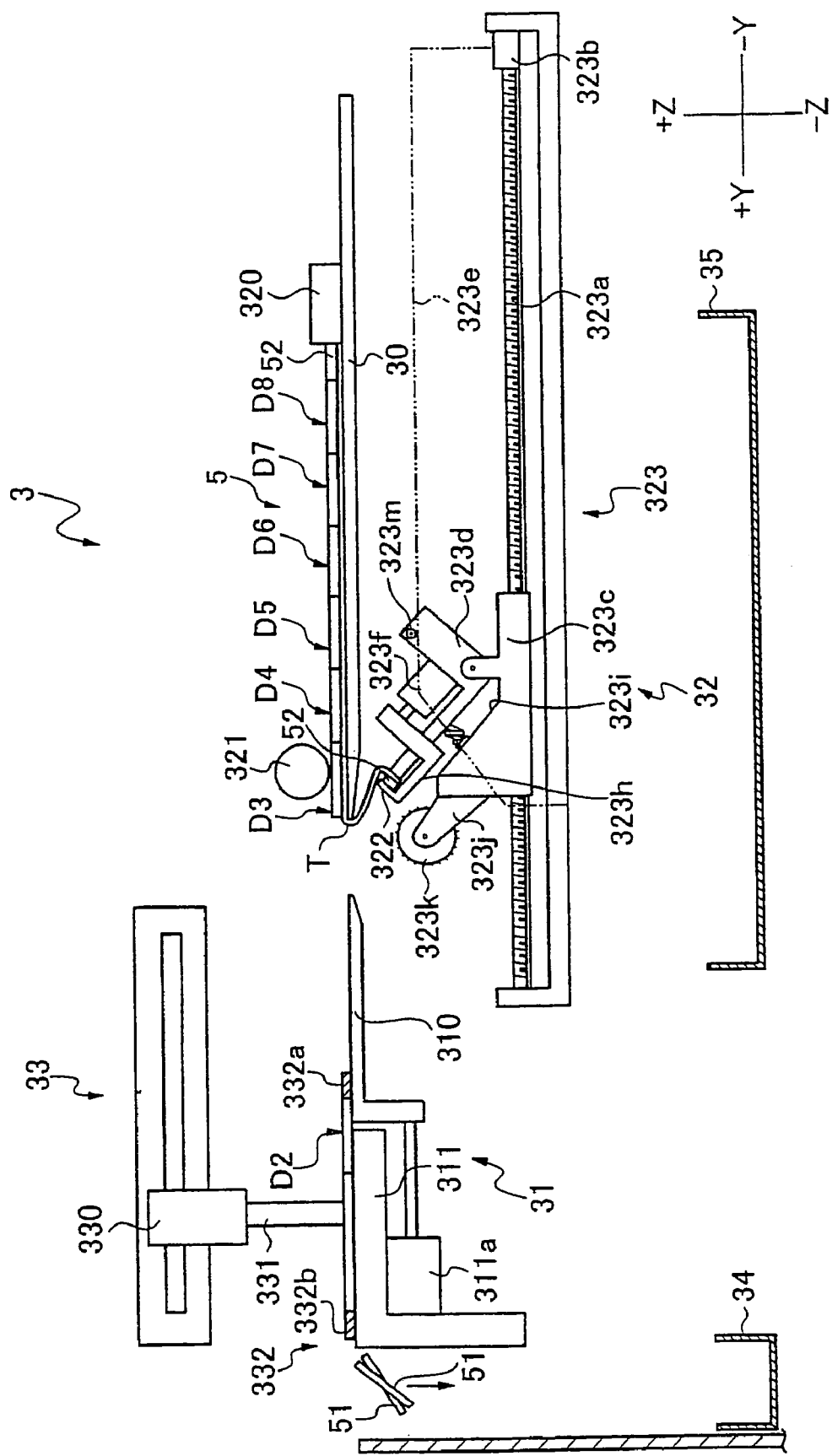
FIG. 19 is a schematic sectional view showing the manner of dropping end materials into an end material accommodation portion in the internal structure of the tape peeling-responsible region.

On the other hand, the end materials 51 kept placed on the second table 311 are discarded into the end material accommodation portion 34 located in the +Y-direction with respect to the second table 311. The mechanism for this is shown in FIG. 19. As shown in FIG. 14, when the first device row D1 is transferred to the second table 311, the protective tape T is peeled from the next second device row D2, and the second device row D2 is placed on the first table 310. When all the devices constituting the first device row D1 are picked up and accommodated into the acceptable product device case 6a or the defective product device case 6b, an operation for transferring the second device row D2 placed on the first table 310 to the second table 311 is performed. This operation is carried out by approaching the first table 310 to the second table 311, and then moving the push-out portion 332 in the +Y-direction, causing the device push-out portion 332a to push in the second device row D2, as in the same manner as shown in FIGS. 12 and 13. At this time, the end material push-out portion 332b constituting the push-out portion 332 pushes in the end materials 51 constituting the first device row D1 in the +Y-direction, as shown in FIG. 19. Thus, simultaneously with the operation for transferring the second device row D2 from the first table 310 to the second table 311, the end materials 51 constituting the first device row D1 can be pushed out in the +Y-direction by the end material push-out portion 332b, dropped downward and accommodated into the end material accommodation portion 34. This is very efficient, and obviates the necessity for providing a dedicated contrivance for accommodating the end materials 51 into the end material accommodation portion 34.

Figure 20:
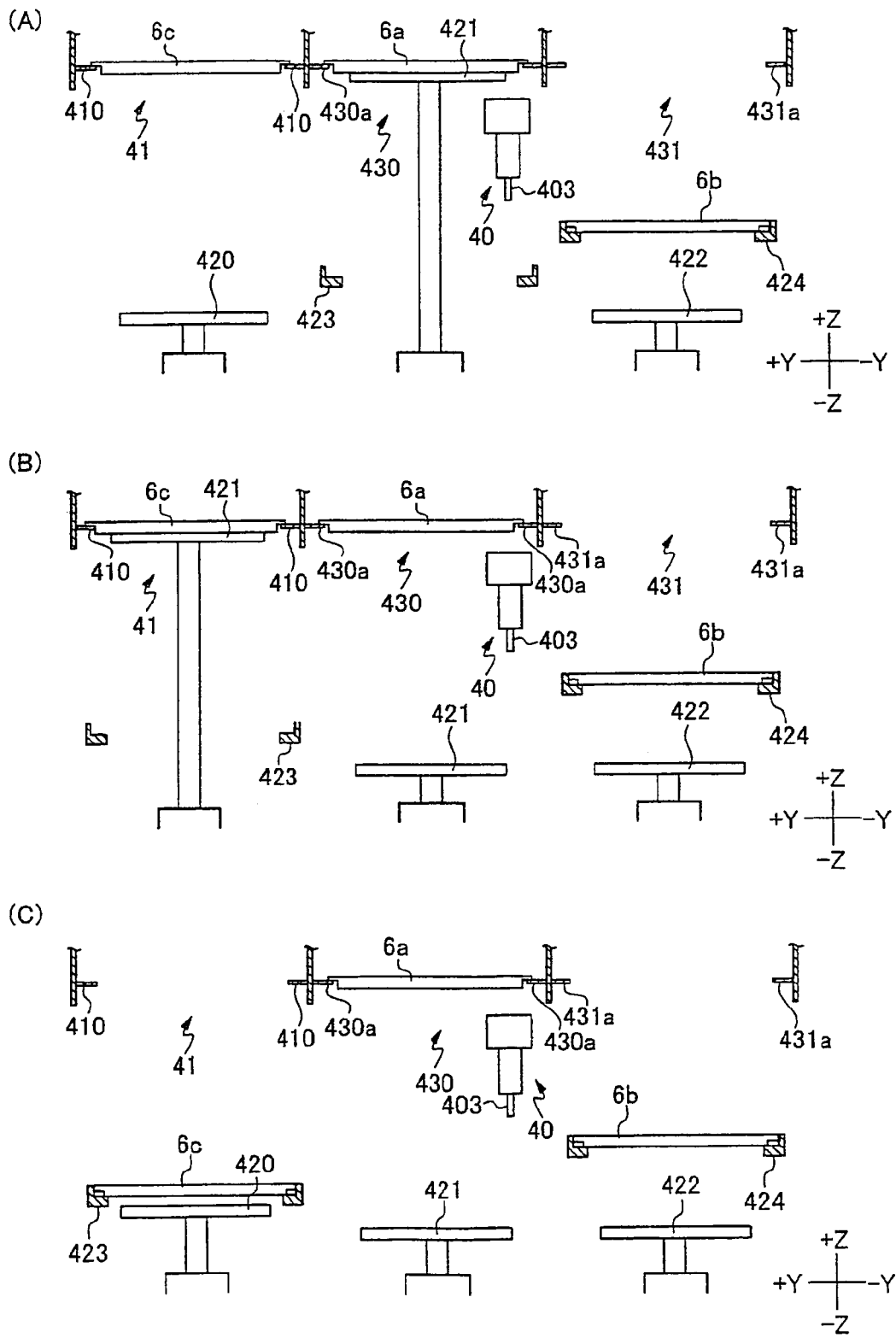
FIGS. 20(A) to 20(C) are schematic sectional views showing an example of an action for storing the acceptable product device case into an acceptable product device case storage portion and withdrawing a new empty device case in the device accommodation-responsible region, FIG. 20(A) showing a state in which the acceptable product device case is stored into the acceptable product device case storage portion, FIG. 20(B) showing a state in which the empty device case is newly withdrawn from the empty device case storage portion, and FIG. 20(C) showing a state in which the withdrawn empty device case is accommodated in the first case frame.

As described above, the device row made up of the devices to be newly picked up is transferred from the first table 310 to the second table 311, and the end materials constituting the device row whose pickup has ended are simultaneously discarded. During this process, the devices are sequentially picked up by the pickup means 40 and accommodated into the device case, as shown in FIG. 18. When the devices as acceptable products have been accommodated in all regions of the acceptable product device case 6a, as shown in FIG. 20(A), the defective product device case 6b is moved to a position where it does not overlap the acceptable product device case 6a. Then, the second ascending and descending plate 421 ascends, and the second protruding pieces 430a are retracted, whereupon the acceptable product device case 6a is stored in the acceptable product device case storage portion 430. Then, as shown in FIG. 20(B), when the second ascending and descending plate 421 lowers to return to its original position, the first case frame 423 is moved to a position directly below the empty device case storage portion 41. Then, the first ascending and descending plate 420 is raised to withdraw the empty device case 6c newly from the empty device case storage portion 41. When the first ascending and descending plate 420 is lowered, the withdrawn empty device case 6c is accommodated into the first case frame 423. Subsequent actions are the same as those in FIGS. 16(A) to 16(C) and 17(A) to 17(C). Similarly, when the devices as defective products have been accommodated in all region slots of the defective product device case 6b, the defective product device case 6b is stored in the defective product device case storage portion 431, and a different empty device case is newly withdrawn from the empty device case storage portion 41, and accommodated into the second case frame 424.

Figure 21:
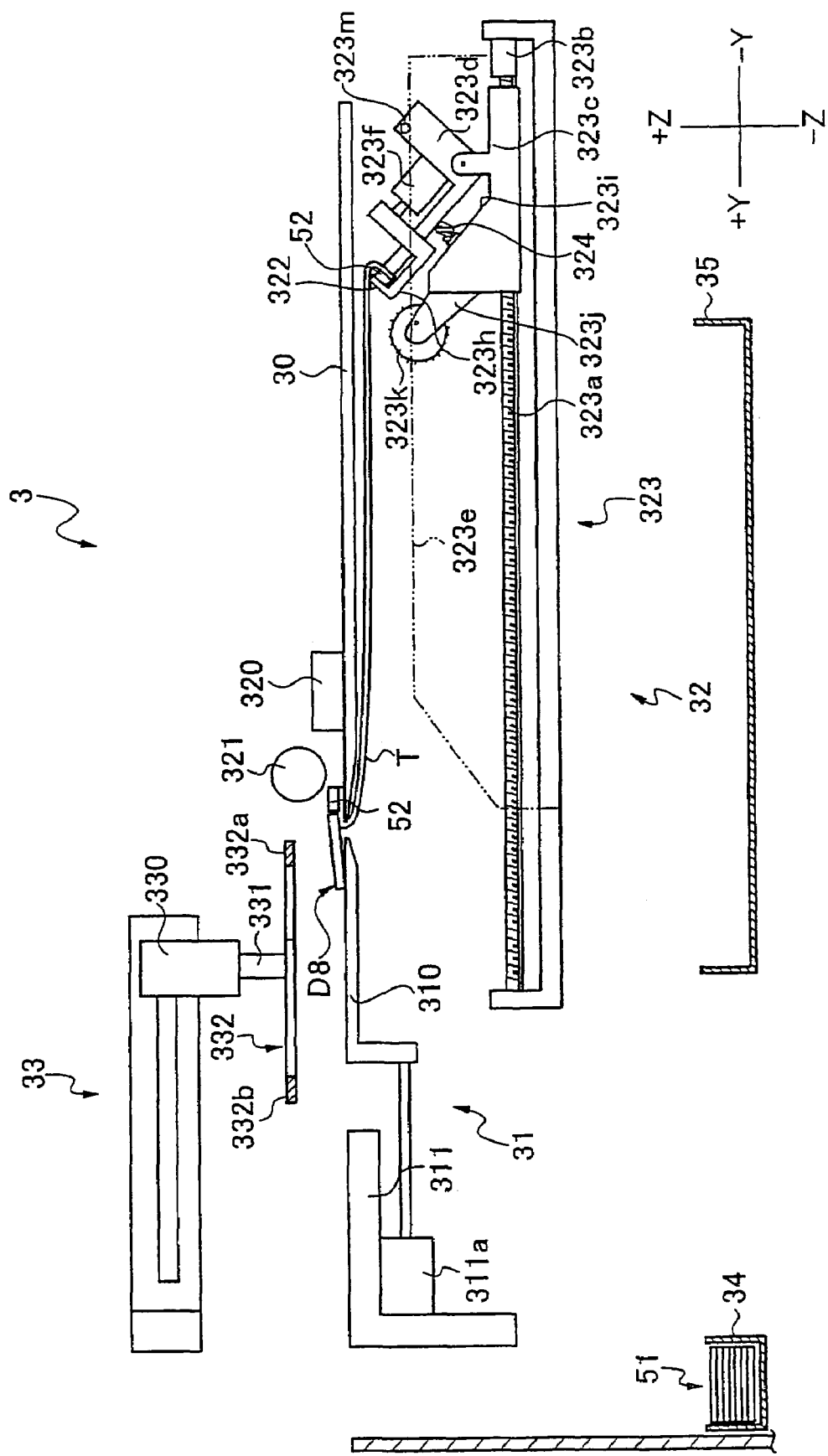
FIG. 21 is a schematic sectional view showing the manner of transferring an eighth device row to the first table in the internal structure of the tape peeling-responsible region.
Figure 22:
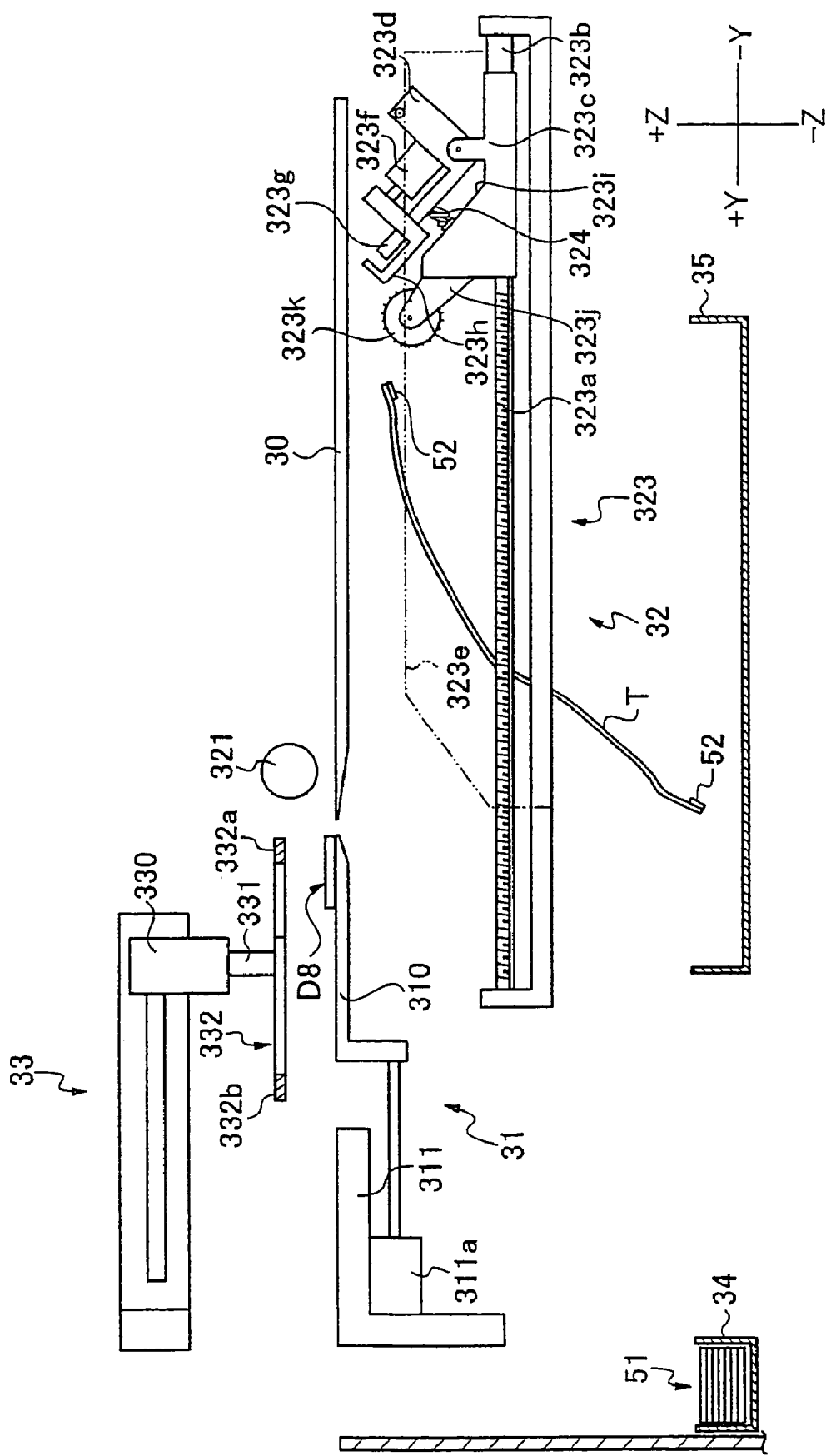
FIG. 22 is a schematic sectional view showing a manner in which a peeled protective tape falls and is accommodated into a protective tape accommodation portion in the internal structure of the tape peeling-responsible region.

As shown in FIG. 21, when the eighth device row D8, the last device row, is stripped of the protective tape T, the eighth device row D8 is transferred to the first table 310. When the base portion 323c is further moved in the −Y-direction, a portion of the protective tape T, which is other than that pinched by the gripping portion 322, falls downward together with the unnecessary end portion 522 adjacent to the eighth device row D8. As shown in FIG. 22, when the gripping portion 322 is raised to release the pinched state, the protective tape T drops downward together with the unnecessary end portions 52 located at both ends. If necessary, the tape detaching roller 323k is turned counterclockwise, whereby the protective tape T and the unnecessary end portions 52 affixed to both ends thereof can be dropped reliably. Since the protective tape accommodation portion 35 is disposed below the device transfer means 32, the dropped protective tape T is accommodated into the protective tape accommodation portion 35.

In the dividing apparatus 1, as described above, the rectangular substrate 5 having the protective tape T affixed to its back is cut and divided into individual devices, followed by cleaning, in the cutting-responsible region 2. In the tape peeling-responsible region 3, the device can be peeled from the protective tape T reliably, easily and efficiently, and transferred to the pickup table. The device transferred to the pickup table 31 can be accommodated into the device case in the device accommodation-responsible region 4. Thus, the procedure ranging from cutting to accommodation of the device can be performed in one apparatus. Since the peeling of the protective tape T and the transfer of the device to the pickup table 31 can be performed simultaneously, productivity is extremely high. Since the use of an annular frame is unnecessary, moreover, a space saving due to downsizing of the apparatus can be achieved.

As shown in FIG. 1, in the cutting-responsible region 2, the cassette table 20, the carry-out means 21, and the cleaning means 24 are disposed on a first straight line 10, the cutting means 23 is disposed on a second straight line 11 perpendicularly intersecting the first straight line 10, and the chuck table 22 is adapted to be movable on the second straight line 11. That is, the cassette table 20, the carry-out means 21, and the cleaning means 24 are disposed on an extension line in the Y-axis direction, while the cutting means 23 and the chuck table 22 are disposed on an extension line in the X-axis direction.

In the tape peeling-responsible region 3, the temporary placement table 30 is disposed on a straight line parallel to the second straight line 11 with respect to the cleaning means 24, and the temporary placement table 30 and the pickup table 31 are disposed on a straight line parallel to the first straight line 10. That is, the temporary placement table 30 is disposed on an extension, in the X-axis direction, of the cleaning means 24, and the pickup table 31 is disposed on an extension, in the Y-axis direction, of the temporary placement table 30. The first table 310 and the second table 311 of the pickup table 31 are also disposed on an extension, in the Y-axis direction, of the temporary placement table 30.

In the device accommodation-responsible region 4, the empty device case storage portion 41 and the accommodated device case storage portion 43 are disposed on a straight line parallel to the first straight line, and the device case positioning means 42 is disposed directly below the empty device case storage portion 41 and directly below the accommodated device case storage portion 43, respectively. That is, the empty device case storage portion 41 and the accommodated device case storage portion 43 are disposed on an extension line in the Y-axis direction, and the device case positioning means 42 is disposed on extensions, in the Z-axis direction, of the empty device case storage portion 41 and the accommodated device case storage portion 43. Furthermore, the cutting-responsible region 2, the tape peeling-responsible region 3, and the device accommodation-responsible region 4 are disposed in the X-axis direction in the order of operating steps.

Because of the above-described positional relationship, the movement of the rectangular substrate 5 is not wasted in any of the cutting-responsible region 2, the tape peeling-responsible region 3, and the device accommodation-responsible region 4. Nor is there a waste in the movement of the rectangular substrate 5 between the respective responsible regions. Thus, a space saving due to the downsizing of the apparatus and a satisfactory efficiency can be achieved.

In the foregoing descriptions, the pickup table 31 is composed of the first table 310 and the second table 311, but one table may constitute the pickup table 31. If the number of the tables is one, the one table may move toward and away from the temporary placement table 30. The one table need not necessarily be movable. Similarly, even when the pickup table 31 is composed of the first table 310 and the second table 311, the first table 310 need not be necessarily movable. If the one table or the first table is fixed, a gap for letting in the gripping portion 322 has to be formed between either table and the temporary placement table 30. In this case, however, when the device is transferred, a pressure is exerted and may damage the device. Thus, the table is desirably adapted to be movable.

What we claim is:

1. A rectangular substrate dividing apparatus for separating into individual devices, a rectangular substrate to whose back a protective tape is affixed, and on which scheduled-separation lines for division of the rectangular substrate into individual devices are formed along the scheduled-separation lines, and on which an unnecessary end portion is on an outer edge portion of the device area, and then accommodating the individual devices in a device case, said rectangular substrate dividing apparatus at least including:

a cutting-responsible region composed of a cassette table for bearing a cassette accommodating a plurality of the rectangular substrates, a carry-out means for carrying a rectangular substrate with only a protective tape affixed to the rectangular substrate out of the cassette, a chuck table for holding the carried-out rectangular substrate, a cutting means for cutting the rectangular substrate held on the chuck table along the scheduled-separation lines to divide the rectangular substrate into the individual devices, and a cleaning means for cleaning the cut rectangular substrate;

a tape peeling-responsible region composed of a temporary placement table for temporarily bearing the cut and cleaned rectangular substrate, a pickup table for bearing the devices when the individual devices constituting the rectangular substrate are picked up, and a device transfer means having a function of transferring the devices from the temporary placement table to the pickup table while peeling the protective tape affixed to the back of the rectangular substrate; and a device accommodation-responsible region at least including a pickup means for picking up the device transferred to the pickup table and accommodating the device into the device case, an empty device case storage portion for storing an empty device case, a device case positioning means for withdrawing the empty device case from the empty device case storage portion and bringing the empty device case to a device accommodation position which is a position where the device can be accommodated by the pickup means, and an accommodated device case storage portion for storing the device case accommodating the devices, wherein in the above tape peeling-responsible region, the pickup table is composed of a first table and a second table, the second table is disposed with a predetermined spacing from the temporary placement table, and the first table is disposed to be movable between the temporary placement table and the second table, the device transfer means is composed of a gripping portion for gripping the unnecessary end portion of the rectangular substrate, which is placed on the temporary placement table, together with the protective tape, a press roller for pressing the rectangular substrate placed on the temporary placement table, a pusher for pushing the rectangular substrate between the press roller and the temporary placement table and moving the rectangular substrate toward the first table when the first table is located at a position closest to the temporary placement table, and a gripping portion drive portion for lowering the gripping portion at least below the temporary placement table so as to separate the unnecessary end portion of the rectangular substrate from the devices and peel the protective tape from the back of the rectangular substrate, above the pickup table, a device moving means is disposed which moves the devices placed on the first table to the second table when the first table is located at a position closest to the second table, and the devices are placed on the first table, and the pickup means picks up the device moved to the second table.

2. The rectangular substrate dividing apparatus according to claim 1, wherein the gripping portion drive portion is composed of a base portion movable in a direction separated from the first table, a pivotal portion pivotably supported by the base portion, a guide member for guiding a pivotal movement of the pivotal portion, and a raising and lowering drive portion fixed to the pivotal portion for raising and lowering the gripping portion.

3. The rectangular substrate dividing apparatus according to claim 1, wherein a protective tape accommodation portion, which accommodates the protective tape peeled from the rectangular substrate by the gripping portion drive portion, is disposed below the temporary placement table.

4. The rectangular substrate dividing apparatus according to claim 1, wherein an end material accommodation portion for accommodating end materials constituting the cut rectangular substrate is disdosed beyond the first table and the second table, and the device moving means is furnished with a device push-out portion for pushing out and moving the devices placed on the first table toward the second table, and an end material push-out portion for pushing out the end materials remaining on the second table to drop the end materials from the second table into the end material accommodation portion.

5. The rectangular substrate dividing apparatus according to claim 1, wherein in the device accommodation-responsible region, the pickup means includes a determination portion for determining whether the device, as an object to be picked up, is an acceptable product or a defective product, the device case is composed of an acceptable product device case for accommodating the devices as acceptable products, and a defective product device case for accommodating the devices as defective products, the accommodated device case storage portion is composed of an acceptable product device case storage portion for storing the acceptable product device case, and a defective product device case storage portion for storing the defective product device case, and the device case positioning means is composed of an acceptable product device case positioning means for withdrawing the empty device case from the empty device case storage portion, and bringing the empty device case, as an acceptable product device case, to an acceptable product device accommodation position which is a position for accommodation of the device as an acceptable product, and a defective product device case positioning means for withdrawing the empty device case from the empty device case storage portion, and bringing the empty device case, as a defective product device case, to a defective product device accommodation position which is a position for accommodation of the device as a defective product.

6. The rectangular substrate dividing apparatus according to claim 1, wherein the cutting-responsible region is provided with a posture correction means for correcting a posture of the rectangular substrate carried out of the cassette, a first transport means for holding the rectangular substrate having the posture corrected by the posture correction means, and placing the rectangular substrate on the chuck table, a second transport means for transporting the cut rectangular substrate held on the chuck table to the cleaning means, and a third transport means for transporting the cleaned rectangular substrate to the temporary placement table.

7. The rectangular substrate dividing apparatus according to claim 1, wherein in the cutting-responsible region, two or more of the cassettes can be placed on the cassette table, and a cassette positioning means is disposed which selectively brings the cassette table to a position where the rectangular substrate accommodated in any of the cassettes can be carried out by the cany-out means.

8. The rectangular substrate dividing apparatus according to claim 1, wherein in the cutting-responsible region, the cassette table, the carry-out means, and the cleaning means are disposed on a first straight line, the cutting means is disposed on a second straight line perpendicularly intersecting the first straight line, and the chuck table is adapted to be movable on the second straight line, in the tape peeling-responsible region, the temporary placement table is disposed on a straight line parallel to the second straight line with respect to the cleaning means, and the temporary placement table and the pickup table are disposed on a straight line parallel to the first straight line, and in the device accommodation-responsible region, the empty device case storage portion and the accommodated device case storage portion are disposed on a straight line parallel to the first straight line, and the device case positioning means is disposed directly below the empty device case storage portion and directly below the accommodated device case storage portion, respectively.

* * * * *